United States Patent
Kurata et al.

(10) Patent No.: US 9,368,636 B2
(45) Date of Patent: Jun. 14, 2016

(54) METHOD FOR MANUFACTURING A SEMICONDUCTOR DEVICE COMPRISING A PLURALITY OF OXIDE SEMICONDUCTOR LAYERS

(71) Applicant: Semiconductor Energy Laboratory Co., Ltd., Atsugi-shi, Kanagawa-ken (JP)

(72) Inventors: Motomu Kurata, Isehara (JP); Shinya Sasagawa, Chigasaki (JP); Taiga Muraoka, Yamato (JP); Hiroaki Honda, Odawara (JP); Takashi Hamada, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/227,459

(22) Filed: Mar. 27, 2014

(65) Prior Publication Data

US 2014/0291674 A1    Oct. 2, 2014

(30) Foreign Application Priority Data

Apr. 1, 2013 (JP) ................... 2013-075696

(51) Int. Cl.
*H01L 27/12* (2006.01)
*H01L 29/786* (2006.01)
(Continued)

(52) U.S. Cl.
CPC ...... *H01L 29/7869* (2013.01); *H01L 21/02334* (2013.01); *H01L 27/1225* (2013.01); *H01L 29/66969* (2013.01); *H01L 29/78696* (2013.01)

(58) Field of Classification Search
CPC ................. H01L 21/02334; H01L 27/1225; H01L 29/66969; H01L 29/7869
See application file for complete search history.

(56) References Cited

U.S. PATENT DOCUMENTS 5,567,645 A * 10/1996 Ahn ................. H01L 21/76202
257/E21.552
5,731,856 A   3/1998 Kim et al.
(Continued)

FOREIGN PATENT DOCUMENTS

EP    1737044 A    12/2006
EP    2226847 A     9/2010
(Continued)

OTHER PUBLICATIONS

Kim, S. et al. "Analysis of the Hump Characteristics in Poly-Si Thin Film Transistors." ECS Transactions, 3 (8), pp. 63-67 (2006).*
(Continued)

*Primary Examiner* — Tom Thomas
*Assistant Examiner* — Christopher M Roland
(74) *Attorney, Agent, or Firm* — Robinson Intellectual Property Law Office; Eric J. Robinson

(57) ABSTRACT

A substrate having an insulating surface is prepared; a stacked film including a first oxide semiconductor layer and a second oxide semiconductor layer is formed over the substrate; a mask layer is formed over part of the stacked film and then dry etching treatment is performed, so that the stacked film is removed, with a region provided with the mask layer remaining, and a reaction product is formed on a side surface of the remaining stacked film; the reaction product is removed by wet etching treatment after removal of the mask layer; a source electrode and a drain electrode are formed over the stacked film; and a third oxide semiconductor layer, a gate insulating film, and a gate electrode are stacked and formed in this order over the stacked film, and the source electrode and the drain electrode.

10 Claims, 20 Drawing Sheets

(51) Int. Cl.
  *H01L 29/66* (2006.01)
  *H01L 21/02* (2006.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 8,237,166 | B2 | 8/2012 | Kumomi et al. |
| 8,547,771 | B2 | 10/2013 | Koyama |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0286828 | A1* | 12/2005 | Sakuma ............... G02B 6/136 385/14 |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0000649 | A1* | 1/2009 | Lee .................. 134/28 |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0038641 | A1* | 2/2010 | Imai ................ 257/57 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0109003 | A1* | 5/2010 | Akimoto et al. ........... 257/43 |
| 2011/0127523 | A1* | 6/2011 | Yamazaki ............ 257/43 |
| 2011/0240990 | A1* | 10/2011 | Yamazaki ............ 257/43 |
| 2011/0240991 | A1 | 10/2011 | Yamazaki |
| 2011/0240992 | A1* | 10/2011 | Yamazaki ............ 257/43 |
| 2012/0001170 | A1* | 1/2012 | Yamazaki ............ 257/43 |
| 2012/0052624 | A1* | 3/2012 | Yamazaki ............ 438/104 |
| 2014/0034946 | A1 | 2/2014 | Yamazaki et al. |
| 2014/0042437 | A1 | 2/2014 | Yamazaki |
| 2014/0042438 | A1 | 2/2014 | Yamazaki |
| 2014/0138674 | A1* | 5/2014 | Sato et al. ............ 257/43 |
| 2014/0306217 | A1* | 10/2014 | Yamazaki et al. ........ 257/43 |
| 2014/0326992 | A1* | 11/2014 | Hondo et al. ........... 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2012-257187 | 12/2012 |
| WO | WO-2004/114391 | 12/2004 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett.(Physical Review Letters), May 4, 1981, vol. 46, No. 18, pp. 1216-1219.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, andYb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposisum Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Parks et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED"AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9: Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT"AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon exposure to water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, 2008, vol. 39, pp. 1277-1280.

Oba.F et al., "Defect energetics in ZnO: a hybrid Hartree-Fock density functional study", Phys. Rev. B (Physical Review: B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 3008, pp. 581-584.

Asakuma.N et al., "Crystallization and Reduction of Sol-Gel-Derived Zinc Oxide Films by Irradiation with Ultraviolet Lamp", Journal of Sol-gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2005, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

FIG. 3A1
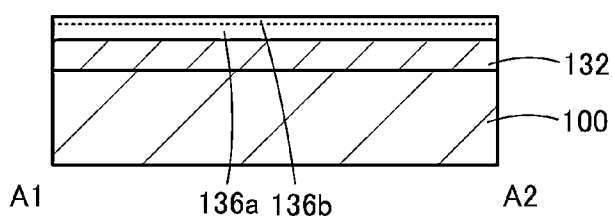
FIG. 3A2
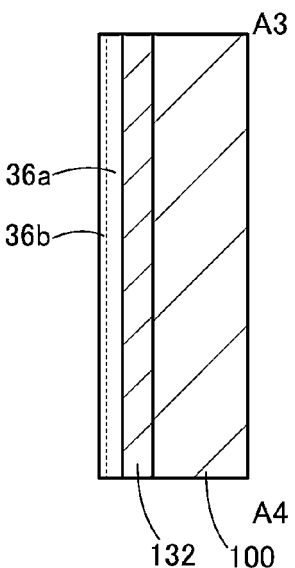
FIG. 3B1
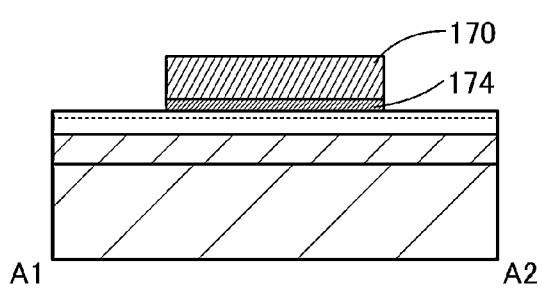
FIG. 3B2
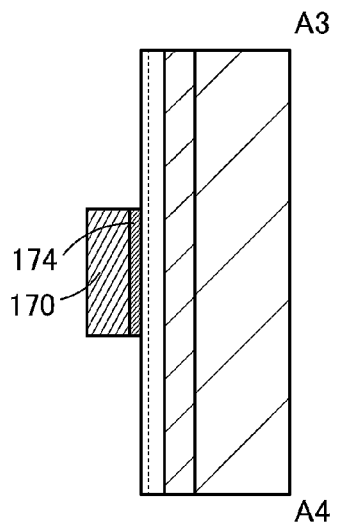

FIG. 4A1
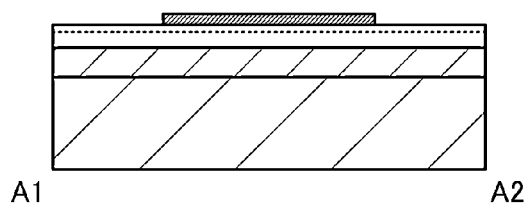
FIG. 4A2
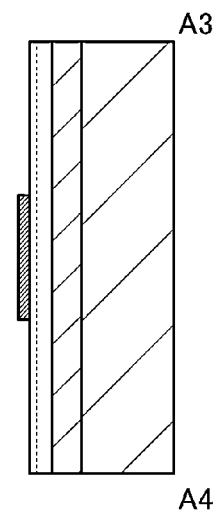
FIG. 4B1
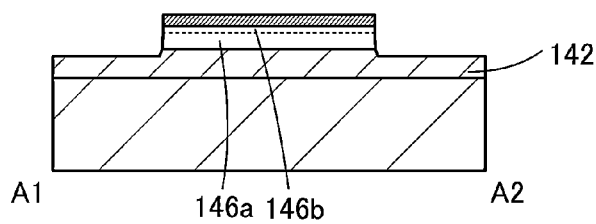
FIG. 4B2
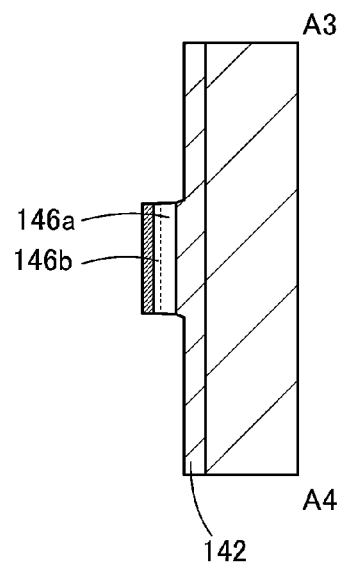

FIG. 5A1
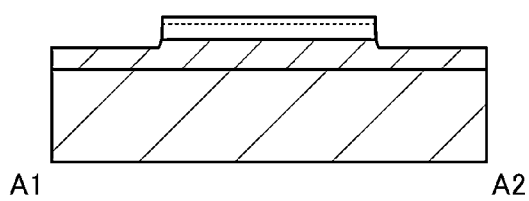
FIG. 5A2
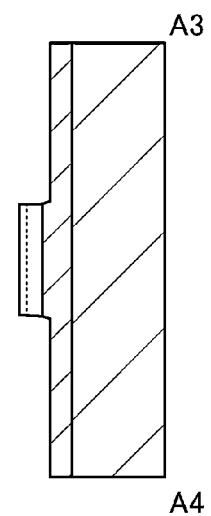
FIG. 5B1
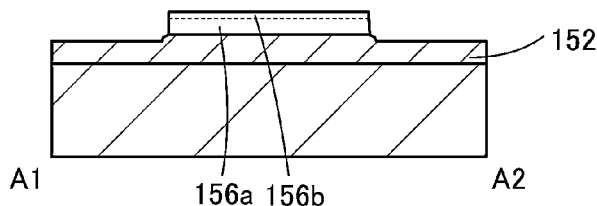
FIG. 5B2
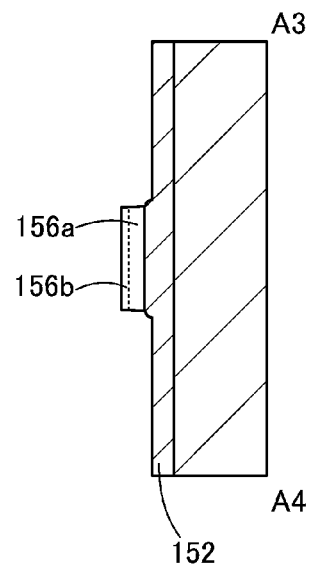

FIG. 6A1
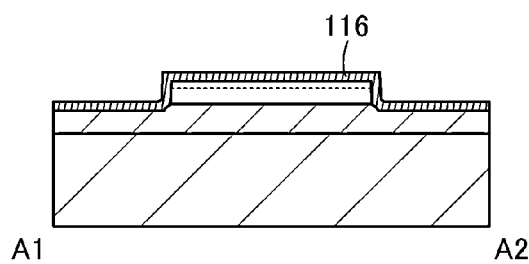
FIG. 6A2
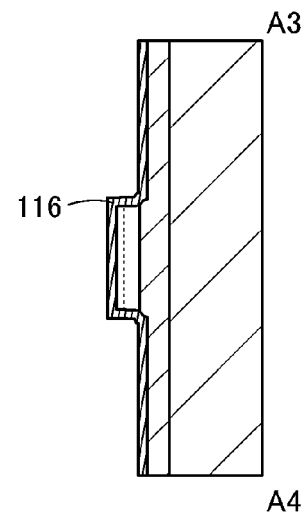
FIG. 6B1
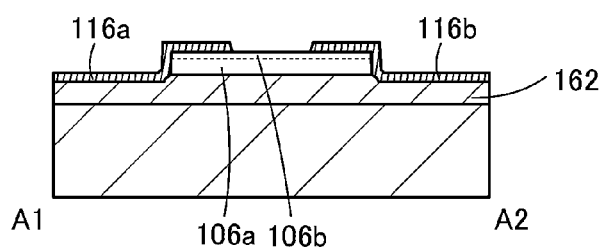
FIG. 6B2
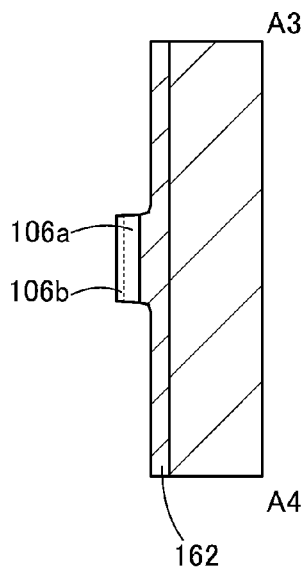

FIG. 7A1
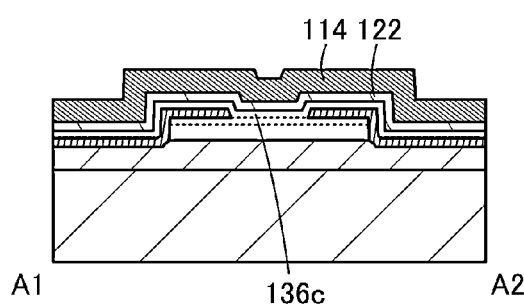
FIG. 7A2
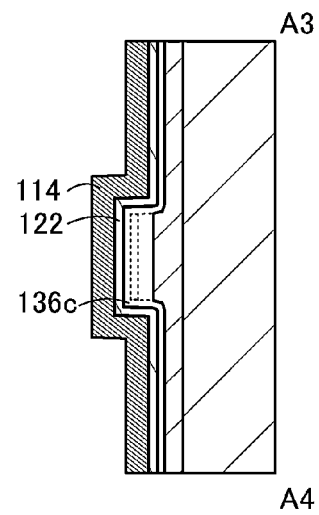
FIG. 7B1
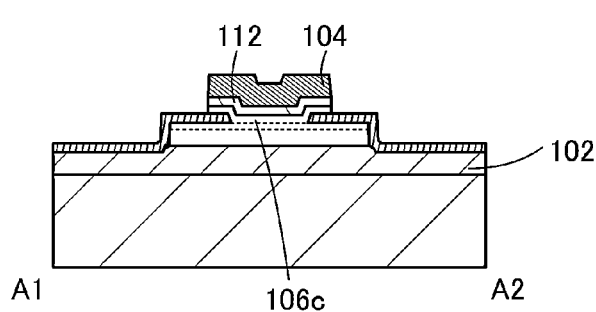
FIG. 7B2
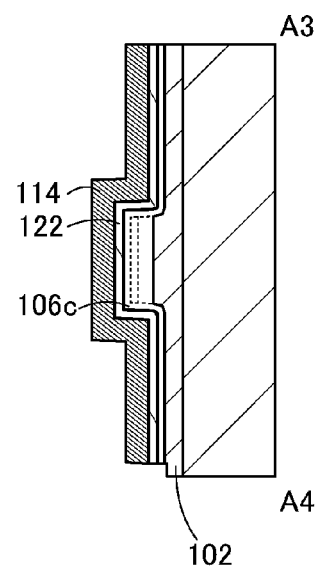

FIG. 8A1
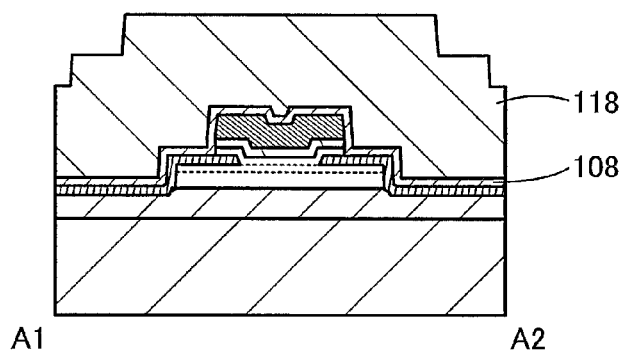
FIG. 8A2
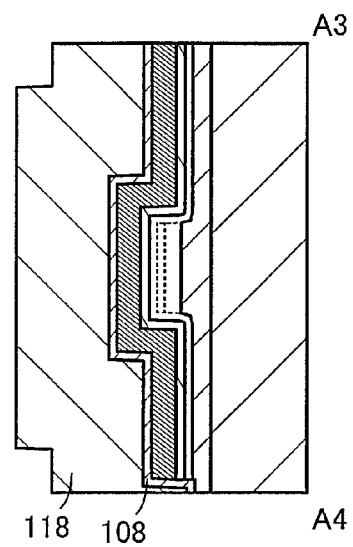

FIG. 10A1
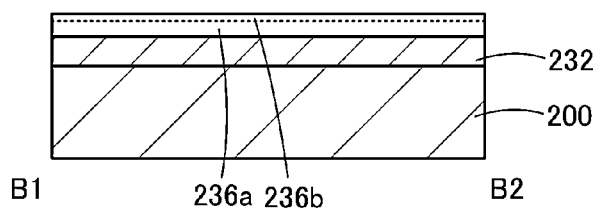
FIG. 10A2
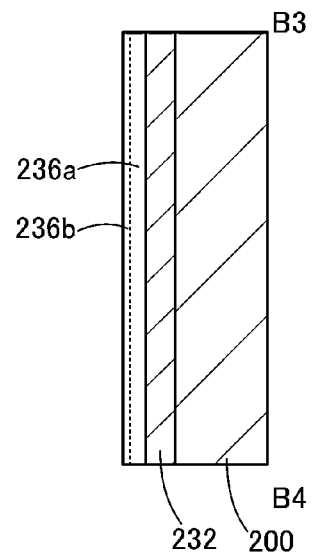
FIG. 10B1
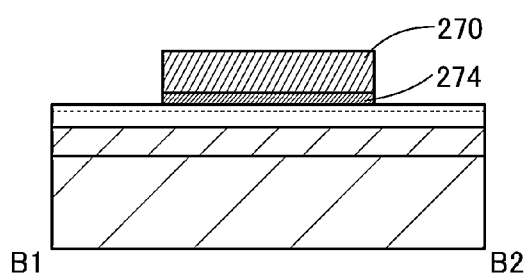
FIG. 10B2
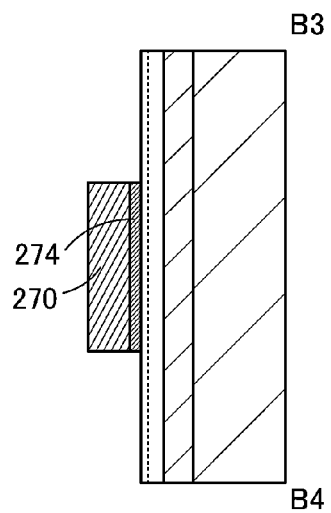

FIG. 11A1
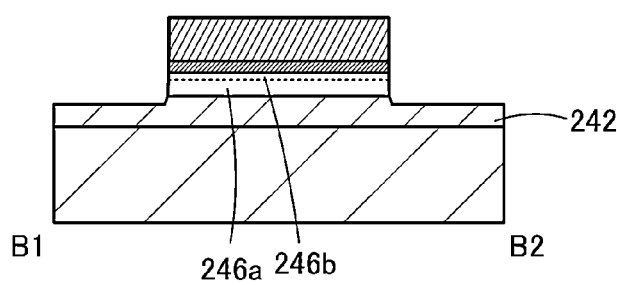
FIG. 11A2
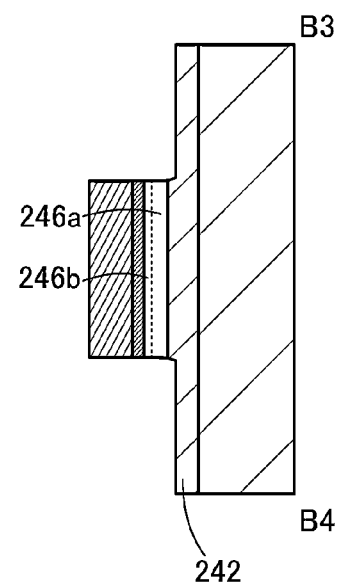
FIG. 11B1
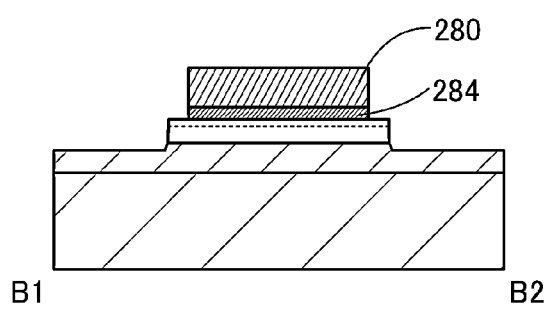
FIG. 11B2
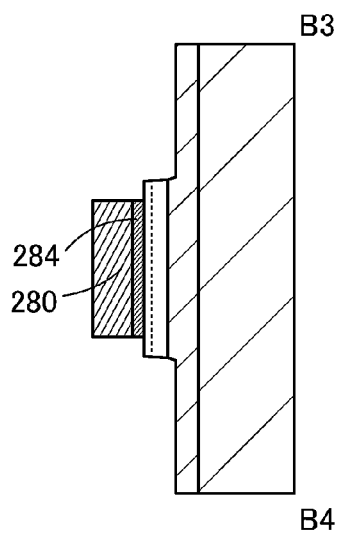

FIG. 12A1
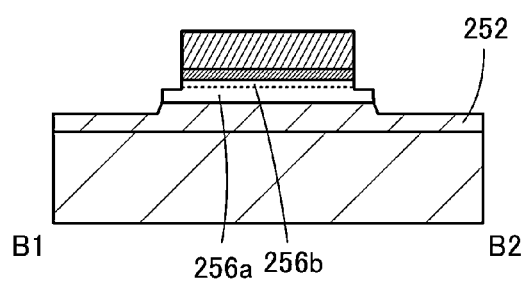
FIG. 12A2
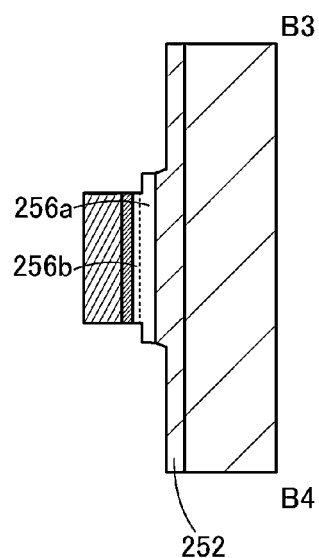
FIG. 12B1
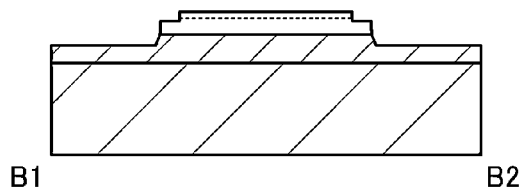
FIG. 12B2
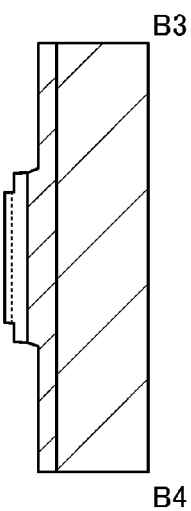

FIG. 13A1
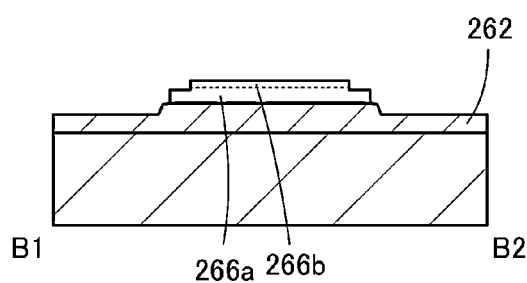
FIG. 13A2
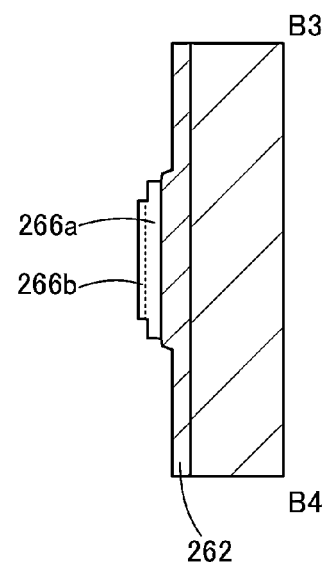
FIG. 13B1
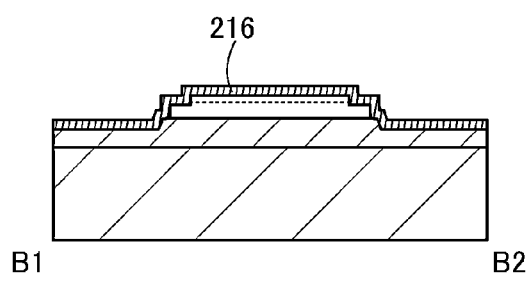
FIG. 13B2
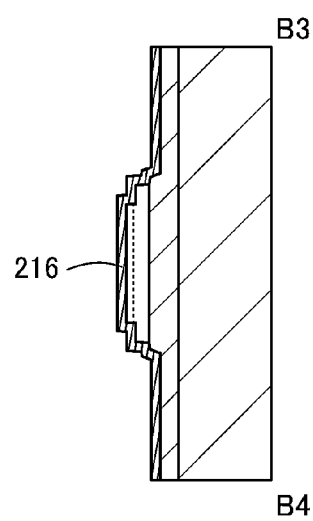

FIG. 14A1
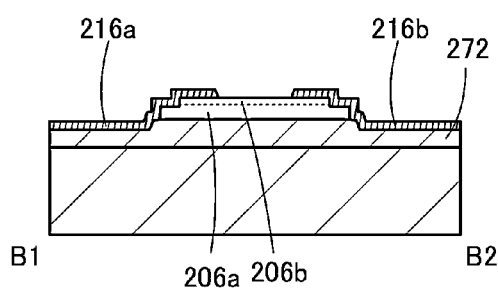
FIG. 14A2
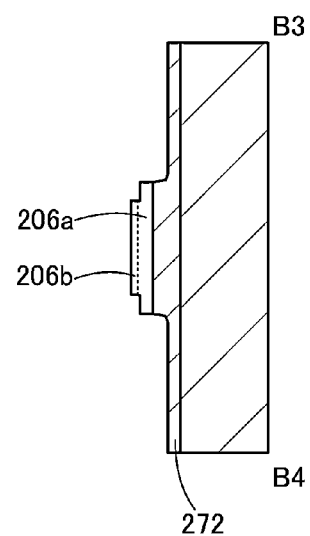
FIG. 14B1
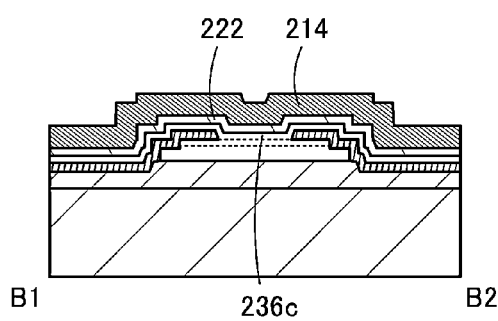
FIG. 14B2
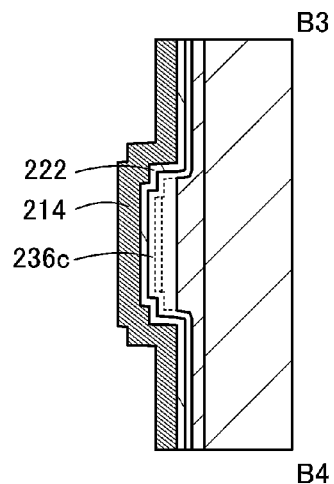

FIG. 15A1
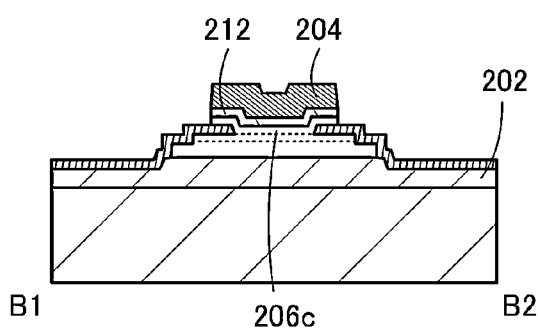
FIG. 15A2
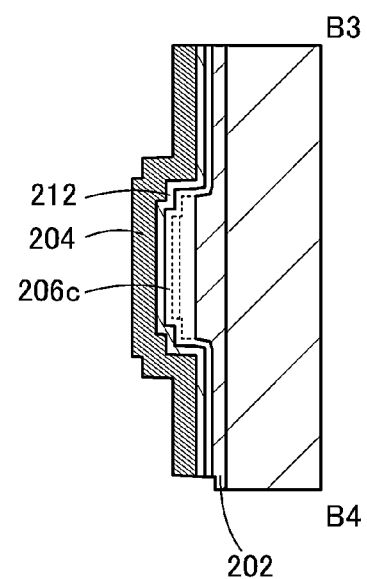
FIG. 15B1
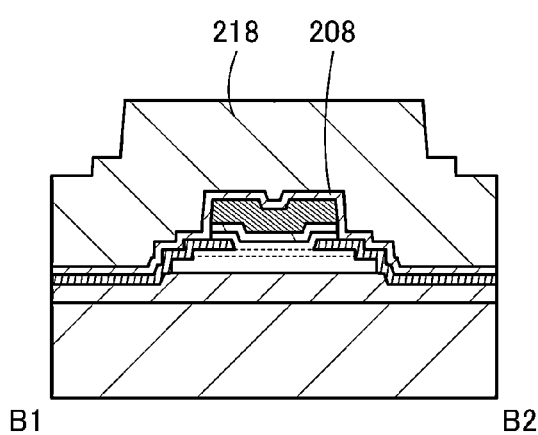
FIG. 15B2
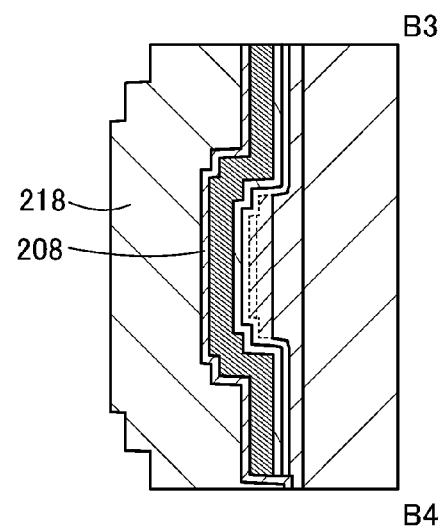

FIG. 19A  <Cross-section in Channel Width Direction>
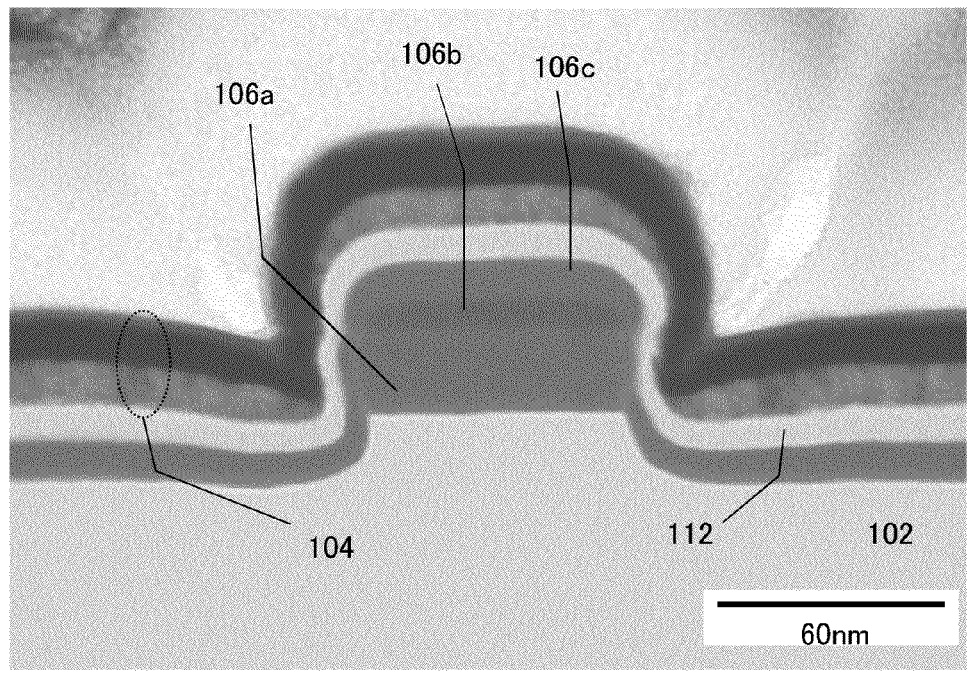
FIG. 19B  <Cross-section in Channel Length Direction>
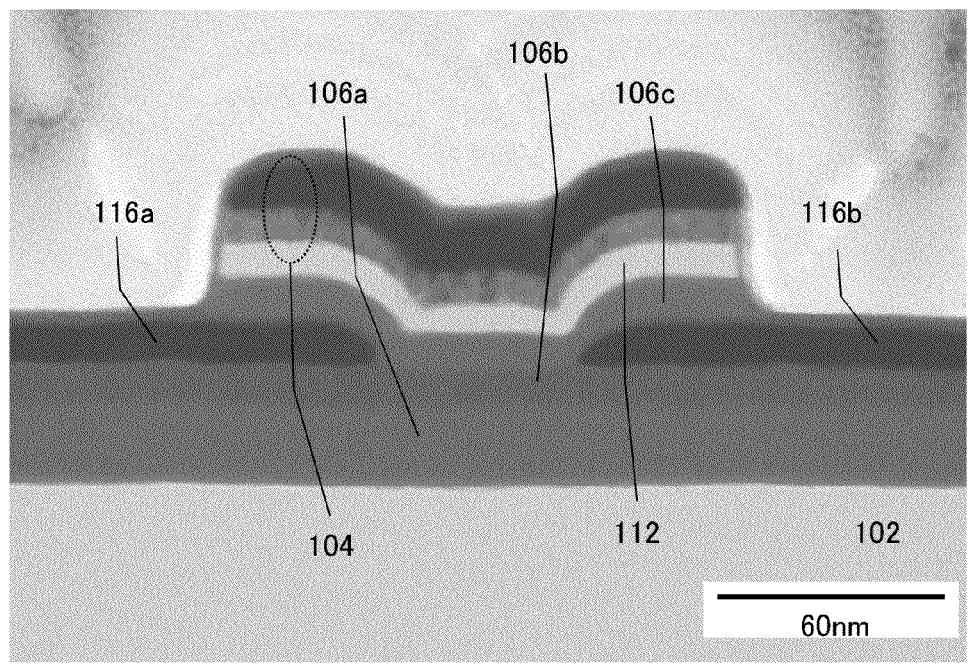

METHOD FOR MANUFACTURING A SEMICONDUCTOR DEVICE COMPRISING A PLURALITY OF OXIDE SEMICONDUCTOR LAYERS

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to a semiconductor device, a display device, a liquid crystal display device, a light-emitting device, a driving method thereof, or a manufacturing method thereof, for example. Furthermore, the present invention relates to a semiconductor device, a display device, or a light-emitting device each including a transistor, or a driving method thereof, for example. Alternatively, the present invention relates to an electronic appliance including the semiconductor device, the display device, or the light-emitting device, for example.

Note that in this specification, a semiconductor device refers to any device that can function by utilizing semiconductor characteristics, and an electro-optical device, a semiconductor circuit, an electronic appliance, and the like are all included in the category of the semiconductor device.

2. Description of the Related Art

A technique by which a transistor is formed using a semiconductor film formed over a substrate having an insulating surface has been attracting attention. The transistor is applied to a wide range of semiconductor devices such as an integrated circuit and a display device. A silicon film is known as a semiconductor film applicable to a transistor.

As the silicon film used as a semiconductor film of a transistor, either an amorphous silicon film or a polycrystalline silicon film is used depending on the purpose. For example, in the case of a transistor included in a large-sized display device, it is preferable to use an amorphous silicon film, which can be formed using the established technique for forming a film on a large-sized substrate. On the other hand, in the case of a transistor included in a high-performance display device where driver circuits are formed over the same substrate, it is preferable to use a polycrystalline silicon film, which can form a transistor having a high field-effect mobility. As a method for forming a polycrystalline silicon film, high-temperature heat treatment or laser light treatment which is performed on an amorphous silicon film has been known.

In recent years, an oxide semiconductor film has attracted attention. For example, a transistor which includes an amorphous oxide semiconductor film containing indium, gallium, and zinc is disclosed (see Patent Document 1).

An oxide semiconductor film can be formed by a sputtering method or the like, and thus can be used for a channel formation region of a transistor in a large display device. A transistor including an oxide semiconductor film has a high field-effect mobility; therefore, a high-performance display device where driver circuits are formed over the same substrate can be obtained. Moreover, there is an advantage that capital investment can be reduced because part of production equipment for a transistor including an amorphous silicon film can be retrofitted and utilized.

A transistor including an oxide semiconductor film is known to have an extremely low leakage current in an off state. For example, a CPU or the like with low-power consumption utilizing the low leakage current characteristics of the transistor including an oxide semiconductor film is disclosed (see Patent Document 2).

REFERENCE

Patent Document

[Patent Document 1] Japanese Published Patent Application No. 2006-165528
[Patent Document 2] Japanese Published Patent Application No. 2012-257187

SUMMARY OF THE INVENTION

An object is to provide a transistor having excellent electrical characteristics. Another object is to provide a transistor having a miniaturized structure. Another object is to provide a transistor having a high on-state current. Another object is to provide a transistor having stable electrical characteristics.

Another object is to provide a transistor having a low off-state current. Another object is to provide a transistor having a high field-effect mobility. Another object is to provide a transistor with a high yield. Another object is to provide a semiconductor device or the like including the transistor. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is, for example, a method for manufacturing a semiconductor device including the steps of preparing a substrate having an insulating surface; forming a stacked film including a first oxide semiconductor layer and a second oxide semiconductor layer over the substrate; forming a mask layer over part of the stacked film and then performing dry etching treatment, so that the stacked film is removed, with a region provided with the mask layer remaining, and a reaction product is formed on a side surface of the remaining stacked film; removing the reaction product by wet etching treatment after removal of the mask layer; forming a source electrode and a drain electrode over the stacked film; and stacking a third oxide semiconductor layer, a gate insulating film, and a gate electrode in this order over the stacked film, and the source electrode and the drain electrode.

Another embodiment of the present invention is, for example, a method for manufacturing a semiconductor device including the steps of preparing a substrate having an insulating surface; forming a stacked film including a first oxide semiconductor layer and a second oxide semiconductor layer over the substrate; forming a mask layer over part of the stacked film and then performing dry etching treatment, so that the stacked film is removed, with a region provided with the mask layer remaining, and a reaction product is formed on a side surface of the remaining stacked film; reducing the mask layer and then performing dry etching treatment so that half etching treatment is performed on a region of the stacked film which is exposed by reducing the mask layer; removing the reaction product by wet etching treatment after removal of the mask layer; forming a source electrode and a drain electrode over the stacked film; and stacking and forming a third oxide semiconductor layer, a gate insulating film, and a gate electrode in this order over the stacked film, and the source electrode and the drain electrode.

Alternatively, the mask layer is removed by, for example, dry etching treatment.

The dry etching treatment is performed on the stacked film, for example, in an atmosphere containing methane or a rare gas.

The wet etching treatment is performed on the reaction product using, for example, an aqueous solution containing hydrogen fluoride, phosphate, nitric acid, acetic acid, or oxalic acid.

For example, in the case where the source electrode and the drain electrode are formed by stacking a first conductive layer and a second conductive layer in this order, after formation of the first conductive layer, the first conductive layer is washed with water at a temperature higher than or equal to 25° C. and lower than or equal to 100° C.

Another embodiment of the present invention is, for example, a semiconductor device including a substrate having an insulating surface; a stacked film including a first oxide semiconductor layer and a second oxide semiconductor layer over the substrate; a source electrode and a drain electrode over the stacked film; a third oxide semiconductor layer over the stacked film, and the source electrode and the drain electrode; a gate insulating film over the third oxide semiconductor layer; and a gate electrode over the gate insulating film, and the stacked film has a step from a center toward an outer portion.

Alternatively, the first oxide semiconductor layer, the second oxide semiconductor layer, and the third oxide semiconductor layer each contain, for example, indium.

For example, energy at a bottom of a conduction band of each of the first oxide semiconductor layer and the third oxide semiconductor layer is closer to a vacuum level than energy at a bottom of a conduction band of the second oxide semiconductor layer is by 0.07 eV or more and 1.3 eV or less.

For example, the first oxide semiconductor layer, the second oxide semiconductor layer, and the third oxide semiconductor layer are each an In-M-Zn oxide (M is Al, Ti, Ga, Y, Zr, La, Ce, Nd, or Hf), and atomic ratios of In to M of the first oxide semiconductor layer and the third oxide semiconductor layer are smaller than an atomic ratio of In to M of the second oxide semiconductor layer.

For example, the distance between the source electrode and the drain electrode over the stacked film is less than or equal to 100 nm.

For example, in a region between the source electrode and the drain electrode over the stacked film, a line connecting center points in the region between the source electrode and the drain electrode is less than or equal to 100 nm.

A transistor having excellent electrical characteristics can be provided. A transistor having a miniaturized structure can be provided. A transistor having a high on-state current can be provided. A transistor having stable electrical characteristics can be provided.

A transistor having a low off-state current can be provided. A transistor having a high field-effect mobility can be provided. A transistor with a high yield can be provided. A semiconductor device or the like including the transistor can be provided. A novel semiconductor device or the like can be provided.

BRIEF DESCRIPTION OF THE DRAWINGS

FIGS. 3A1, 3A2, 3B1, and 3B2 are cross-sectional views illustrating an example of a method for manufacturing a transistor of one embodiment of the present invention.

FIGS. 4A1, 4A2, 4B1, and 4B2 are cross-sectional views illustrating an example of the method for manufacturing a transistor of one embodiment of the present invention.

FIGS. 5A1, 5A2, 5B1, and 5B2 are cross-sectional views illustrating an example of the method for manufacturing a transistor of one embodiment of the present invention.

FIGS. 6A1, 6A2, 6B1, and 6B2 are cross-sectional views illustrating an example of the method for manufacturing a transistor of one embodiment of the present invention.

FIGS. 7A1, 7A2, 7B1, and 7B2 are cross-sectional views illustrating an example of the method for manufacturing a transistor of one embodiment of the present invention.

FIGS. 8A1 and 8A2 are cross-sectional views illustrating an example of the method for manufacturing a transistor of one embodiment of the present invention.

FIGS. 10A1, 10A2, 10B1, and 10B2 are cross-sectional views illustrating an example of a method for manufacturing a transistor of one embodiment of the present invention.

FIGS. 11A1, 11A2, 11B1, and 11B2 are cross-sectional views illustrating an example of the method for manufacturing a transistor of one embodiment of the present invention.

FIGS. 12A1, 12A2, 12B1, and 12B2 are cross-sectional views illustrating an example of the method for manufacturing a transistor of one embodiment of the present invention.

FIGS. 13A1, 13A2, 13B1, and 13B2 are cross-sectional views illustrating an example of the method for manufacturing a transistor of one embodiment of the present invention.

FIGS. 14A1, 14A2, 14B1, and 14B2 are cross-sectional views illustrating an example of the method for manufacturing a transistor of one embodiment of the present invention.

FIGS. 15A1, 15A2, 15B1, and 15B2 are cross-sectional views illustrating an example of the method for manufacturing a transistor of one embodiment of the present invention.

FIGS. 19A and 19B are STEM images.

DETAILED DESCRIPTION OF THE INVENTION

Figure 1A:
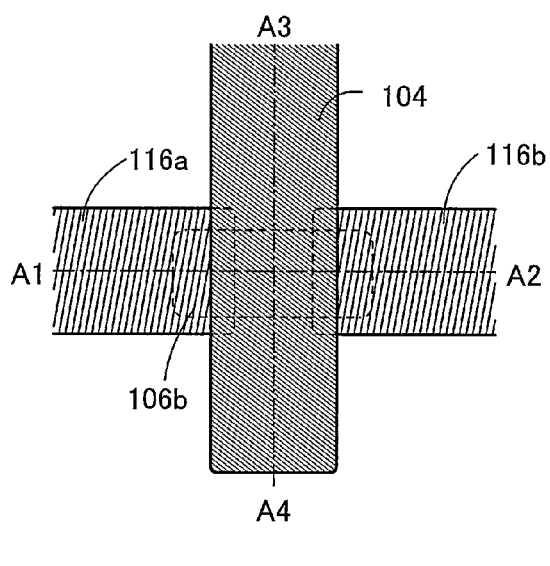
FIGS. 1A to 1C are a top view and cross-sectional views illustrating an example of a transistor of one embodiment of the present invention.

An embodiment and examples of the present invention will be described in detail below with reference to the drawings. However, the present invention is not limited to the description below, and it is easily understood by those skilled in the art that modes and details can be modified in various ways. Furthermore, the present invention is not construed as being limited to description of the embodiment and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that what is described in one embodiment can be applied to, combined with, or exchanged with another content in the same embodiment.

Note that the size, the thickness of layers, or regions in drawings is sometimes exaggerated for simplicity and is not limited to such a scale.

A voltage usually refers to a potential difference between a given potential and a reference potential (e.g., a source potential or a ground potential (GND)). Thus, a voltage can be referred to as a potential and vice versa.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

In this specification, for example, when the shape of an object is described with the use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. A "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor layer refers to, for example, elements other than the main components of the semiconductor layer. For example, an element with a concentration lower than 0.1 atomic % is an impurity. When an impurity is contained, carrier traps may be formed in the semiconductor layer, the carrier mobility may be decreased, or the crystallinity may be lowered, for example. In the case where the semiconductor layer is an oxide semiconductor layer, examples of an impurity which changes characteristics of the semiconductor layer include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case where the semiconductor layer is an oxide semiconductor layer, oxygen vacancies may be formed by entry of an impurity. Furthermore, in the case where the semiconductor layer is a silicon layer, examples of an impurity which changes characteristics of the semiconductor layer include oxygen, Group 1 elements except hydrogen, Group 2 elements, Group 13 elements, and Group 15 elements.

In this specification, excess oxygen refers to oxygen in excess of the stoichiometric composition, for example. Alternatively, excess oxygen refers to oxygen released by heating, for example. Excess oxygen can move inside a film or a layer. Excess oxygen moves between atoms in a film or a layer or excess oxygen replace oxygen that is a constituent of a film or a layer and moves like a billiard ball. An insulating film containing excess oxygen means an insulating film from which oxygen is released by heat treatment, for example.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

<Description of Structure of Transistor and Manufacturing Method Thereof>

The structure of the transistor and a manufacturing method thereof are described below.

<Transistor Structure (1)>

First, an example of a top-gate top-contact transistor is described.

Figure 1C:
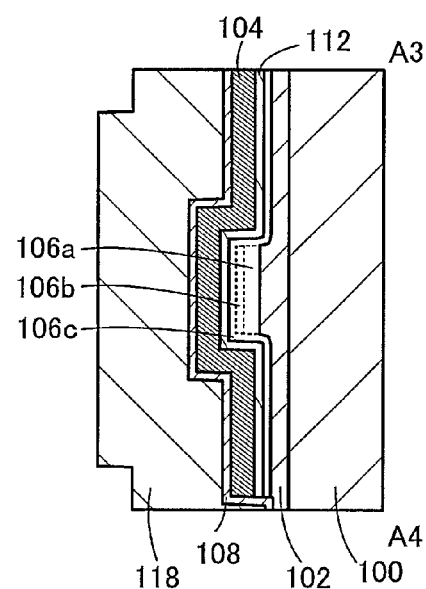
Figure 1B:
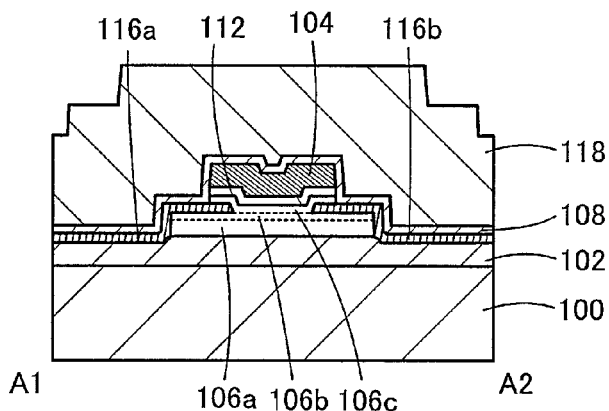

FIGS. 1A to 1C are a top view and cross-sectional views of the transistor. FIG. 1A is a top view of the transistor. FIG. 1B is the cross-sectional view taken along dashed-dotted line A1-A2 in FIG. 1A. FIG. 1C is the cross-sectional view taken along dashed-dotted line A3-A4 in FIG. 1A.

A transistor in FIG. 1B which is the cross-sectional view in a channel length direction includes a base insulating film 102 over a substrate 100, an oxide semiconductor layer 106a over the base insulating film 102, an oxide semiconductor layer 106b over the oxide semiconductor layer 106a, a source electrode 116a and a drain electrode 116b over the oxide semiconductor layer 106b, an oxide semiconductor layer 106c over the oxide semiconductor layer 106b, and the source electrode 116a and the drain electrode 116b, a gate insulating film 112 over the oxide semiconductor layer 106c, and a gate electrode 104 over the gate insulating film 112. Note that preferably, a protective insulating film 108 is provided over the source electrode 116a and the drain electrode 116b, the oxide semiconductor layer 106c, the gate insulating film 112, and the gate electrode 104; and a protective insulating film 118 is provided over the protective insulating film 108. Note that the transistor does not necessarily include the base insulating film 102.

Note that the stacking order of the protective insulating film 108 and the protective insulating film 118 may be reversed.

In FIG. 1A which is the top view, the distance between the source electrode 116a and the drain electrode 116b in a region where the oxide semiconductor layer 106b and the gate electrode 104 overlap with each other is called a channel length. Moreover, in the overlapped region of the oxide semiconductor layer 106b and the gate electrode 104, a line connecting the center points in the region between the source electrode 116a and the drain electrode 116b is called a channel width. Note that a channel formation region refers to a region, which overlaps with the gate electrode 104 and is provided between the source electrode 116a and the drain electrode 116b, in the oxide semiconductor layer 106b. Furthermore, a channel refers to a region through which current mainly flows in the channel formation region.

Note that in FIG. 1C which is the cross-sectional view in a channel width direction, the electric field of the gate electrode 104 is also applied to the lateral side of the oxide semiconductor layer 106b. For example, in the case where the channel width of the transistor is less than or equal to 100 nm, preferably less than or equal to 60 nm, further preferably less than or equal to 40 nm, a high electric field is applied to the lateral side of the oxide semiconductor layer 106b. Accordingly, the on-state characteristics of the transistor (e.g., current when the transistor is turned on or field-effect mobility) and the off-state characteristics thereof (e.g., current when the transistor is turned off) can be improved. Furthermore, a punch-through phenomenon can be suppressed; thus, normally-off electrical characteristics can be obtained even in a transistor with a small channel length. Thus, the transistor has excellent electrical characteristics.

Note that as illustrated in FIG. 1A, the gate electrode 104 is provided such that the edge of the oxide semiconductor layer 106b is located on the inner side of the edge of the gate electrode 104 in the top view. With such a structure, when light irradiation is performed from the gate electrode 104 side, generation of carriers in the oxide semiconductor layer 106b due to light can be suppressed. In other words, the gate electrode 104 functions as a light-blocking film. Note that the oxide semiconductor layer 106b may be provided outside the gate electrode 104.

The oxide semiconductor layer 106a, the oxide semiconductor layer 106b, and the oxide semiconductor layer 106c are described below.

The oxide semiconductor layer 106b is an oxide containing indium. An oxide can have a high carrier mobility (electron mobility) by containing indium, for example. In addition, the oxide semiconductor layer 106b preferably includes an element M. The element M is aluminum, gallium, yttrium, or tin, for example. The element M is an element having a high bonding energy with oxygen, for example. The element M is an element that can increase the energy gap of the oxide, for example. In addition, the oxide semiconductor layer 106b preferably contains zinc. When the oxide contains zinc, the oxide is easily crystallized, for example. The energy at the top of the valence band of the oxide can be controlled with the atomic ratio of zinc, for example.

Note that the oxide semiconductor layer 106b is not limited to the oxide containing indium. The oxide semiconductor layer 106b may be a Zn—Sn oxide or a Ga—Sn oxide, for example.

The oxide semiconductor layer 106a is an oxide semiconductor layer which includes one or more kinds of elements other than oxygen included in the oxide semiconductor layer 106b. Furthermore, since the oxide semiconductor layer 106a includes one or more kinds of elements other than oxygen included in the oxide semiconductor layer 106b, an interface state is less likely to be formed at the interface between the oxide semiconductor layer 106b and the oxide semiconductor layer 106a.

The oxide semiconductor layer 106c is an oxide semiconductor layer which includes one or more kinds of elements other than oxygen included in the oxide semiconductor layer 106b. Furthermore, since the oxide semiconductor layer 106c includes one or more kinds of elements other than oxygen included in the oxide semiconductor layer 106b, an interface state is less likely to be formed at the interface between the oxide semiconductor layer 106b and the oxide semiconductor layer 106c.

In the case of using an In-M-Zn oxide as the oxide semiconductor layer 106a, when summation of In and M is assumed to be 100 atomic %, the proportions of In and M are preferably set to be less than 50 atomic % and greater than or equal to 50 atomic %, respectively, and further preferably less than 25 atomic % and greater than or equal to 75 atomic %, respectively. In the case of using an In-M-Zn oxide as the oxide semiconductor layer 106b, when summation of In and M is assumed to be 100 atomic %, the proportions of In and M are preferably set to be greater than or equal to 25 atomic % and less than 75 atomic %, respectively, and further preferably greater than or equal to 34 atomic % and less than 66 atomic %, respectively. In the case of using an In-M-Zn oxide as the oxide semiconductor layer 106c, when summation of In and M is assumed to be 100 atomic %, the proportions of In and M are preferably set to be less than 50 atomic % and greater than or equal to 50 atomic %, respectively, and further preferably less than 25 atomic % and greater than or equal to 75 atomic %, respectively. Note that the oxide semiconductor layer 106c may be an oxide that is a type the same as that of the oxide semiconductor layer 106a.

Here, in some cases, there is a mixed region of the oxide semiconductor layer 106a and the oxide semiconductor layer 106b between the oxide semiconductor layer 106a and the oxide semiconductor layer 106b. Furthermore, in some cases, there is a mixed region of the oxide semiconductor layer 106b and the oxide semiconductor layer 106c between the oxide semiconductor layer 106b and the oxide semiconductor layer 106c. The mixed region has a low interface state density. For that reason, the stack of the oxide semiconductor layer 106a, the oxide semiconductor layer 106b, and the oxide semiconductor layer 106c has a band structure where energy at each interface and in the vicinity of the interface is changed continuously (continuous junction).

As the oxide semiconductor layer 106b, an oxide with a wide energy gap is used. For example, the energy gap of the oxide semiconductor layer 106b is set to be greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Furthermore, for example, the energy gap of the oxide semiconductor layer 106c is set to be greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

As the oxide semiconductor layer 106a, an oxide with a wide energy gap is used. For example, the energy gap of the oxide semiconductor layer 106a is set to be greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

As the oxide semiconductor layer 106c, an oxide with a wide energy gap is used. Furthermore, for example, the energy gap of the oxide semiconductor layer 106c is set to be greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV. Note that the oxide semiconductor layer 106a and the oxide semiconductor layer 106c have wider energy gaps than the oxide semiconductor layer 106b.

As the oxide semiconductor layer 106b, an oxide having an electron affinity higher than that of the oxide semiconductor layer 106a is used. For example, as the oxide semiconductor layer 106b, an oxide having an electron affinity higher than that of the oxide semiconductor layer 106a by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the bottom of the conduction band.

As the oxide semiconductor layer 106b, an oxide having an electron affinity higher than that of the oxide semiconductor layer 106c is used. For example, as the oxide semiconductor layer 106b, an oxide having an electron affinity higher than that of the oxide semiconductor layer 106c by 0.07 eV or higher and 1.3 eV or lower, preferably 0.1 eV or higher and 0.7 eV or lower, further preferably 0.15 eV or higher and 0.5 eV or lower is used. Note that the electron affinity refers to an energy difference between the vacuum level and the bottom of the conduction band.

At this time, when an electric field is applied to the gate electrode 104, a channel is formed in the oxide semiconductor layer 106b having the highest electron affinity of the oxide semiconductor layer 106a, the oxide semiconductor layer 106b, the oxide semiconductor layer 106c.

Moreover, the thickness of the oxide semiconductor layer 106c is preferably as small as possible to increase the on-state current of the transistor. The thickness of the oxide semiconductor layer 106c is set to be less than 10 nm, preferably less than or equal to 5 nm, further preferably less than or equal to 3 nm, for example. Meanwhile, the oxide semiconductor layer 106c has a function of blocking elements other than oxygen (such as silicon) included in the gate insulating film 112 from entering the oxide semiconductor layer 106b where a channel is formed. For this reason, it is preferable that the oxide semiconductor layer 106c have a certain thickness. The thickness of the oxide semiconductor layer 106c is set to be greater than or equal to 0.3 nm, preferably greater than or equal to 1 nm, further preferably greater than or equal to 2 nm, for example.

To improve reliability, preferably, the thickness of the oxide semiconductor layer 106a is large, the thickness of the oxide semiconductor layer 106b is small, and the thickness of the oxide semiconductor layer 106c is small. Specifically, the thickness of the oxide semiconductor layer 106a is set to be greater than or equal to 20 nm, preferably greater than or equal to 30 nm, further preferably greater than or equal to 40 nm, still further preferably greater than or equal to 60 nm With the oxide semiconductor layer 106a having a thickness greater than or equal to 20 nm, preferably greater than or equal to 30 nm, further preferably greater than or equal to 40 nm, still further preferably greater than or equal to 60 nm, the distance from the interface between the base insulating film 102 and the oxide semiconductor layer 106a to the oxide semiconductor layer 106b where the channel is formed can be greater than or equal to 20 nm, preferably greater than or equal to 30 nm, further preferably greater than or equal to 40 nm, still further preferably greater than or equal to 60 nm Note that since the productivity of a semiconductor device might be reduced, the thickness of the oxide semiconductor layer 106a is set to be less than or equal to 200 nm, preferably less than or equal to 120 nm, further preferably less than or equal to 80 nm. The thickness of the oxide semiconductor layer 106b is set to be greater than or equal to 3 nm and less than or equal to 100 nm, preferably greater than or equal to 3 nm and less than or equal to 80 nm, further preferably greater than or equal to 3 nm and less than or equal to 50 nm.

For example, the oxide semiconductor layer 106a may be thicker than the oxide semiconductor layer 106b, and the oxide semiconductor layer 106b may be thicker than the oxide semiconductor layer 106c.

In the case where the oxide semiconductor layer 106a, the oxide semiconductor layer 106b, and the oxide semiconductor layer 106c are formed by a sputtering method, a target containing indium is preferably used in order to reduce the number of particles. In addition, if an oxide target having a high atomic ratio of the element M is used, the conductivity of the target may be decreased. The element M is aluminum, gallium, yttrium, or tin, for example. In the case where a target containing indium is used, the conductivity of the target can be increased and DC discharge and AC discharge are facilitated; therefore, film formation over a large-sized substrate can be easily performed. Thus, semiconductor devices can be manufactured with high productivity.

In the case where the oxide semiconductor layer 106a is formed by a sputtering method, the atomic ratio of In to M and Zn contained in the target may be 1:1:0.5, 1:1:1, 1:1:2, 1:3:1, 1:3:2, 1:3:4, 1:3:6, 1:6:2, 1:6:4, 1:6:6, 1:6:8, 1:6:10, 1:9:2, 1:9:4, 1:9:6, 1:9:8, 1:9:10, or the like.

In the case where the oxide semiconductor layer 106b is formed by a sputtering method, the atomic ratio of In to M and Zn contained in the target may be 3:1:1, 3:1:2, 3:1:4, 1:1:0.5, 1:1:1, 1:1:2, or the like.

In the case where the oxide semiconductor layer 106c is formed by a sputtering method, the atomic ratio of In to M and Zn contained in the target may be 1:1:0.5, 1:1:1, 1:1:2, 1:3:1, 1:3:2, 1:3:4, 1:3:6, 1:6:2, 1:6:4, 1:6:6, 1:6:8, 1:6:10, 1:9:2, 1:9:4, 1:9:6, 1:9:8, 1:9:10, or the like.

In the cases where the oxide semiconductor layer 106a, the oxide semiconductor layer 106b, and the oxide semiconductor layer 106c are formed by a sputtering method, films having atomic ratios different from the atomic ratios of the targets used may be formed. Especially for zinc, the atomic ratio of zinc in a deposited film is smaller than the atomic ratio of the target in some cases. Specifically, the film in some cases has an atomic ratio of zinc of 40 atomic % to 90 atomic % of the atomic ratio of zinc in the target.

An influence of impurities in the oxide semiconductor layer 106b is described below. In order to obtain stable electrical characteristics of a transistor, it is effective to reduce the concentration of impurities in the oxide semiconductor layer 106b to have lower carrier density so that the oxide semiconductor layer 106b is highly purified. The carrier density of the oxide semiconductor layer 106b is set to be lower than $1\times10^{17}/cm^3$, lower than $1\times10^{15}/cm^3$, or lower than $1\times10^{13}/cm^3$. In order to reduce the concentration of impurities in the oxide semiconductor layer 106b, the concentrations of impurities in adjacent layers are preferably reduced.

For example, silicon in the oxide semiconductor layer 106b might serve as a carrier trap or a carrier generation source. Therefore, the concentration of silicon in a region between the oxide semiconductor layer 106b and the oxide semiconductor layer 106a measured by secondary ion mass spectrometry (SIMS) is set to be lower than $1\times10^{19}$ atoms/cm$^3$, preferably lower than $5\times10^{18}$ atoms/cm$^3$, further preferably lower than $2\times10^{18}$ atoms/cm$^3$. The concentration of silicon in a region between the oxide semiconductor layer 106b and the oxide semiconductor layer 106c measured by SIMS is set to be lower than $1\times10^{19}$ atoms/cm$^3$, preferably lower than $5\times10^{18}$ atoms/cm$^3$, further preferably lower than $2\times10^{18}$ atoms/cm$^3$.

Furthermore, when hydrogen is contained in the oxide semiconductor layer 106b, the carrier density is increased in some cases. The concentration of hydrogen in the oxide semiconductor layer 106b measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. When nitrogen is contained in the oxide semiconductor layer 106b, the carrier density is increased in some cases. The concentration of nitrogen in the oxide semiconductor layer 106b measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the oxide semiconductor layer 106a in order to reduce the concentration of hydrogen in the oxide semiconductor layer 106b. The concentration of hydrogen in the oxide semiconductor layer 106a measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the oxide semiconductor layer 106a in order to reduce the concentration of nitrogen in the oxide semiconductor layer 106b. The concentration of nitrogen in the oxide semiconductor layer 106a measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the oxide semiconductor layer 106c in order to reduce the concentration of hydrogen in the oxide semiconductor layer 106b. The concentration of hydrogen in the oxide semiconductor layer 106c measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the oxide semiconductor layer 106c in order to reduce the concentration of nitrogen in the oxide semiconductor layer 106b. The concentration of nitrogen in the oxide semiconductor layer 106c measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First, a CAAC-OS layer is described.

The CAAC-OS layer is one of oxide semiconductor layers including a plurality of crystal parts, and most of the crystal parts each fit inside a cube whose one side is less than 100 nm Thus, there is a case where a crystal part included in the CAAC-OS layer fits inside a cube whose one side is less than 10 nm, less than 5 nm, or less than 3 nm.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

In this specification, the trigonal and rhombohedral crystal systems are included in the hexagonal crystal system.

On the other hand, when the CAAC-OS layer is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS layer, a peak is not clearly observed even when φ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Furthermore, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is higher than that in the vicinity of the formation surface in some cases. Furthermore, when an impurity is added to the CAAC-OS layer, the crystallinity in a region to which the impurity is added is changed, and the degree of crystallinity in the CAAC-OS layer varies depending on regions.

Note that when the CAAC-OS layer with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS layer. It is preferable that in the CAAC-OS layer, a peak of 2θ appears at around 31° and a peak of 2θ do not appear at around 36°.

The CAAC-OS layer is an oxide semiconductor layer with a low impurity concentration. The impurity means an element other than the main components of the oxide semiconductor layer, such as hydrogen, carbon, silicon, or a transition metal element. In particular, an element (e.g., silicon) which has higher bonding strength with oxygen than a metal element included in the oxide semiconductor layer causes disorder of atomic arrangement in the oxide semiconductor layer because the element deprives the oxide semiconductor layer of oxygen, thereby reducing crystallinity. Furthermore, a heavy metal such as iron or nickel, argon, carbon dioxide, and the like have a large atomic radius (or molecular radius); therefore, when any of such elements is contained in the oxide semiconductor layer, the element causes disorder of the atomic arrangement of the oxide semiconductor layer, thereby reducing crystallinity. Note that the impurity contained in the oxide semiconductor layer might become a carrier trap or a carrier generation source.

The CAAC-OS layer is an oxide semiconductor layer with a low density of defect states. For example, oxygen vacancies in the oxide semiconductor layer serve as carrier traps or serve as carrier generation sources when hydrogen is trapped therein.

The state in which impurity concentration is low and density of defect states is low (the number of oxygen vacancies is small) is referred to as a "highly purified intrinsic" or "substantially highly purified intrinsic" state. A highly-purified intrinsic or substantially highly-purified intrinsic oxide semiconductor layer has few carrier generation sources, and thus can have a low carrier density. Thus, a transistor using the oxide semiconductor layer rarely has a negative threshold voltage (rarely has normally-on characteristics). A highly-purified intrinsic or substantially highly-purified intrinsic oxide semiconductor layer has few carrier traps. Accordingly, the transistor using the oxide semiconductor layer has a small change in electrical characteristics and high reliability. Note that charges trapped by the carrier traps in the oxide semiconductor layer take a long time to be released and may behave like fixed charges. Thus, the transistor using the oxide semiconductor layer with a high impurity concentration and a high density of defect states has unstable electrical characteristics in some cases.

In a transistor using the CAAC-OS layer, change in electrical characteristics due to irradiation with visible light or ultraviolet light is small.

Next, a microcrystalline oxide semiconductor layer is described.

In an image obtained with a TEM, crystal parts cannot be found clearly in the microcrystalline oxide semiconductor layer in some cases. In most cases, the size of a crystal part included in the microcrystalline oxide semiconductor layer is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In an image of the nc-OS layer obtained with a TEM, for example, a boundary between crystal parts is not clearly observed in some cases.

In the nc-OS layer, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS layer does not have regularity of crystal orientation between different crystal parts. Thus, the orientation of the whole film is not observed. Accordingly, in some cases, the nc-OS layer cannot be distinguished from an amorphous oxide semiconductor layer depending on an analysis method. For example, when the nc-OS layer is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS layer obtained by using an electron beam having a probe diameter (e.g., larger than or equal to 50 nm) larger than the diameter of a crystal part. Meanwhile, spots are shown in a nanobeam electron diffraction pattern of the nc-OS layer obtained by using an electron beam having a probe diameter (e.g., larger than or equal to 1 nm and smaller than or equal to 30 nm) close to, or smaller than the diameter of a crystal part. Furthermore, in a nanobeam electron diffraction pattern of the nc-OS layer, regions with high luminance in a circular (ring) pattern are shown in some cases. Also in a nanobeam electron diffraction pattern of the nc-OS layer, a plurality of spots are shown in a ring-like region in some cases.

Since the nc-OS layer is an oxide semiconductor layer having more regularity than the amorphous oxide semiconductor layer, the nc-OS layer has a lower density of defect states than the amorphous oxide semiconductor layer. However, there is no regularity of crystal orientation between different crystal parts in the nc-OS layer; hence, the nc-OS layer has a higher density of defect states than the CAAC-OS layer.

Note that an oxide semiconductor layer may be a stacked film including two or more layers of an amorphous oxide semiconductor layer, a microcrystalline oxide semiconductor layer, and a CAAC-OS layer, for example.

The base insulating film 102 in FIGS. 1A to 1C may be formed to have a single-layer structure or a stacked-layer structure using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The base insulating film 102 may be, for example, a stacked film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is lower than or equal to $3 \times 10^{17}$ spins/cm$^3$, preferably lower than or equal to $5 \times 10^{16}$ spins/cm$^3$ is used. As the silicon nitride layer, a silicon nitride layer from which hydrogen and ammonia are less likely to be released is used. The amount of released hydrogen or ammonia may be measured by thermal desorption spectroscopy (TDS). Furthermore, as the silicon nitride layer, a silicon nitride layer which does not transmit or hardly transmits hydrogen, water, and oxygen is used.

The base insulating film 102 may be, for example, a stacked film including a silicon nitride layer as a first layer, a first silicon oxide layer as a second layer, and a second silicon oxide layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the second silicon oxide layer, a silicon oxide layer containing excess oxygen is used. As the silicon nitride layer, a silicon nitride layer from which hydrogen and ammonia are less likely to be released is used. Furthermore, as the silicon nitride layer, a silicon nitride layer which does not transmit or hardly transmits hydrogen, water, and oxygen is used.

The silicon oxide layer containing excess oxygen means a silicon oxide layer from which oxygen can be released by heat treatment or the like. An insulating film containing excess oxygen means an insulating film from which oxygen is released by heat treatment, for example.

The insulating film containing excess oxygen is capable of reducing oxygen vacancies in the oxide semiconductor layer 106b. Such an oxygen vacancy serves as a hole trap or the like in the oxide semiconductor layer 106b. In addition, hydrogen enters into the site of such an oxygen vacancy and in some cases forms an electron. Thus, by a reduction of oxygen vacancies in the oxide semiconductor layer 106b, the transistor can have stable electrical characteristics.

Here, a film from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in TDS analysis performed in a temperature range of a film surface, which is 100° C. to 700° C., or 100° C. to 500° C.

Further or alternatively, the film from which oxygen is released by heat treatment may contain a peroxide radical. Specifically, the spin density attributed to the peroxide radical is higher than or equal to $5 \times 10^{17}$ spins/cm$^3$. Note that the film containing a peroxide radical may have an asymmetric signal with a g factor of approximately 2.01 in ESR.

The insulating film containing excess oxygen may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

The source electrode 116a and the drain electrode 116b may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

Figure 2A:
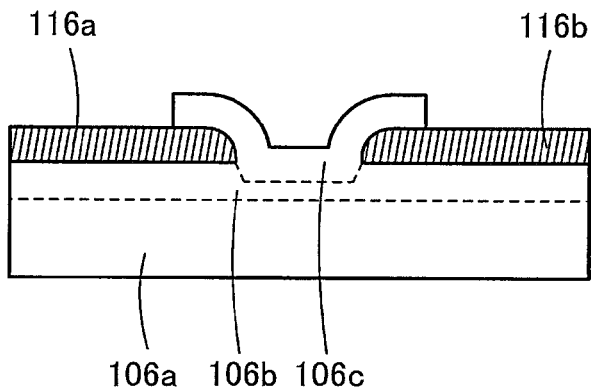
FIGS. 2A to 2C are each a cross-sectional view illustrating an example of a region near a source electrode and a drain electrode of a transistor of one embodiment of the present invention.
Figure 2B:
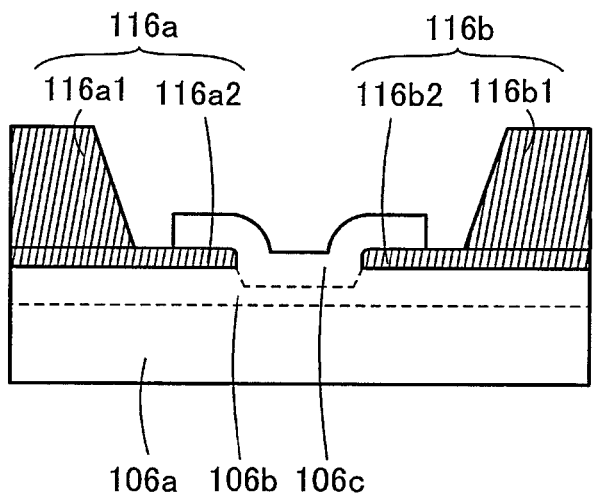
Figure 2C:
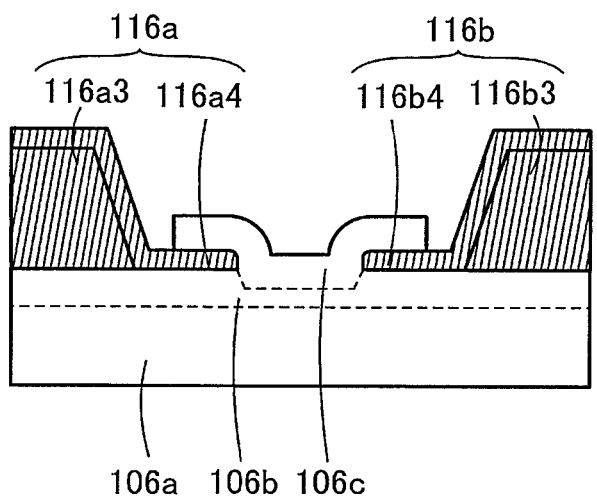

FIGS. 2A to 2C are cross-sectional views of the vicinities of the source electrode 116a and the drain electrode 116b of the transistor. The source electrode 116a and the drain electrode 116b may have any structure illustrated in FIGS. 2A to 2C. In FIGS. 2A to 2C, the top surface of the oxide semiconductor layer 106b is hollowed at the time of the formation of the source electrode 116a and the drain electrode 116b.

FIG. 2A illustrates the source electrode 116a and the drain electrode 116b that have single-layer structures.

In the structure illustrated in FIG. 2B, a conductive layer 116a2 which is not easily oxidized and a conductive layer 116a1 provided over the conductive layer 116a2 are used as the source electrode 116a, and a conductive layer 116b2 which is not easily oxidized and a conductive layer 116b1 provided over the conductive layer 116b2 are used as the drain electrode 116b. Note that the conductive layer which is not easily oxidized is unlikely to reduce the oxide semiconductor layer 106b. When the source electrode 116a and the drain electrode 116b have a structure illustrated in FIG. 2B, diffusion of oxygen vacancies in the channel length direction is small in the oxide semiconductor layer 106b. Furthermore, owing to the conductive layer 116a1 and the conductive layer 116b1, the conductive layer 116a2 and the conductive layer 116b2 can have low conductivity. Thus, the thicknesses of the conductive layer 116a2 and the conductive layer 116b2 can be small, which leads to easy microfabrication. In other words, the structure illustrated in FIG. 2B is favorable for a miniaturized transistor with a small channel length.

Note that the conductive layer 116a1 and the conductive layer 116a2 may be conductive layers of the same kind. In addition, the conductive layer 116b1 and the conductive layer 116b2 may be conductive layers of the same kind.

In the structure illustrated in FIG. 2C, a conductive layer 116a3 and a conductive layer 116a4 which is not easily oxidized and is provided over the conductive layer 116a3 are used as the source electrode 116a, and a conductive layer 116b3 and a conductive layer 116b4 which is not easily oxidized and is provided over the conductive layer 116b3 are used as the drain electrode 116b. When the source electrode 116a and the drain electrode 116b have a structure illustrated in FIG. 2C, diffusion of oxygen vacancies in the channel length direction is small in the oxide semiconductor layer 106b. Furthermore, owing to the conductive layer 116a3 and the conductive layer 116b3, the conductive layer 116a4 and the conductive layer 116b4 can have low conductivity. Thus, the thicknesses of the conductive layer 116a4 and the conductive layer 116b4 can be small, which leads to easy microfabrication. In other words, the structure illustrated in FIG. 2C is favorable for a miniaturized transistor with a small channel length.

Note that the conductive layer 116a3 and the conductive layer 116a4 may be conductive layers of the same kind. In addition, the conductive layer 116b3 and the conductive layer 116b4 may be conductive layers of the same kind.

The gate insulating film 112 in FIGS. 1A to 1C may be formed to have a single-layer structure or a stacked-layer structure using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The gate insulating film 112 may be, for example, a stacked film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon oxide layer, a silicon oxide layer containing excess oxygen is used. As the silicon nitride layer, a silicon nitride layer from which hydrogen and ammonia are less likely to be released is used. The amount of released hydrogen or ammonia may be measured by TDS.

In the case where at least one of the gate insulating film 112 and the base insulating film 102 includes an insulating film containing excess oxygen, oxygen vacancies in the oxide semiconductor layer 106b are reduced, so that the transistor can have stable electrical characteristics.

The gate electrode 104 may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

The protective insulating film 108 may be formed to have a single-layer structure or a stacked-layer structure using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The protective insulating film 108 includes, for example, a silicon nitride layer. In that case, the silicon nitride layer may be a silicon nitride oxide layer. As the silicon nitride layer, a silicon nitride layer from which hydrogen and ammonia are less likely to be released is preferably used. The amount of released hydrogen or ammonia may be measured by TDS. Furthermore, as the silicon nitride layer, a silicon nitride layer which does not transmit or hardly transmits hydrogen, water, and oxygen is preferably used.

The protective insulating film 108 includes, for example, an aluminum oxide layer. As the aluminum oxide layer, an aluminum oxide layer from which hydrogen is less likely to be released is preferable. The amount of released hydrogen may be measured by TDS. Furthermore, as the aluminum oxide layer, an aluminum oxide layer which does not transmit or hardly transmits hydrogen, water, and oxygen is preferably used.

The protective insulating film 118 may be formed to have a single-layer structure or a stacked-layer structure using an insulating film containing one or more of silicon oxide, silicon oxynitride, germanium oxide, yttrium oxide, zirconium oxide, lanthanum oxide, neodymium oxide, hafnium oxide, and tantalum oxide, for example. Owing to the protective insulating film 118, the protective insulating film 108 is not necessarily provided.

There is no large limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

Still alternatively, a flexible substrate may be used as the substrate 100. As a method of providing the transistor over a flexible substrate, there is a method in which the transistor is formed over a non-flexible substrate and then the transistor is separated and transferred to the substrate 100 which is a flexible substrate. In that case, a separation layer is preferably provided between the non-flexible substrate and the transistor.

<Method for Manufacturing Transistor Structure (1)>

An example of a method for manufacturing the transistor structure (1) is described below.

Cross-sectional views corresponding to FIGS. 1B and 1C are shown in FIGS. 3A1, 3A2, 3B1, and 3B2, FIGS. 4A1, 4A2, 4B1, and 4B2, FIGS. 5A1, 5A2, 5B1, and 5B2, FIGS. 6A1, 6A2, 6B1, and 6B2, FIGS. 7A1, 7A2, 7B1, and 7B2, and FIGS. 8A1 and 8A2.

First, the substrate 100 is prepared.

Next, a base insulating film 132 is formed. The base insulating film 132 may be formed using any of the insulating films given as examples of the base insulating film 102. The base insulating film 132 may be formed by a sputtering method, a chemical vapor deposition (CVD) method, a molecular beam epitaxy (MBE) method, an atomic layer deposition (ALD) method, or a pulsed laser deposition (PLD) method.

Alternatively, when a silicon wafer is used as the substrate 100, the base insulating film 132 can be formed by a thermal oxidation method.

Then, in order to planarize the surface of the base insulating film 132, chemical mechanical polishing (CMP) may be performed. By CMP treatment, the average surface roughness (Ra) of the base insulating film 132 is preferably less than or equal to 1 nm, further preferably less than or equal to 0.3 nm, still further preferably less than or equal to 0.1 nm. In some cases, Ra that is less than or equal to the above value can increase the crystallinity of the oxide semiconductor layer 106b. Furthermore, Ra can be measured using an atomic force microscope (AFM).

Then, oxygen ions may be added into the base insulating film 132 so that an insulating film containing excess oxygen can be formed. The addition of oxygen ions is preferably performed by an ion-implantation method at an acceleration voltage of 2 kV to 100 kV and at a dose of $5 \times 10^{14}$ ions/cm$^2$ to $5 \times 10^{16}$ ions/cm$^2$, for example.

Next, an oxide semiconductor layer 136a and an oxide semiconductor layer 136b are formed in this order (see FIGS. 3A1 and 3A2). The oxide semiconductor layer 136a and the oxide semiconductor layer 136b can be formed using any of the oxide semiconductor layers given as examples of the oxide semiconductor layer 106a and the oxide semiconductor layer 106b, respectively. The oxide semiconductor layer 136a and the oxide semiconductor layer 136b may be formed by a sputtering method, a CVD method, an MBE method, an ALD method, or a PLD method.

Next, a layer serving as a hard mask layer 174 and a layer serving as a resist mask layer 170 are formed over the oxide semiconductor layer 136b.

Note that the layer serving as the hard mask layer 174 can be etched selectively with the oxide semiconductor layer 136a and the oxide semiconductor layer 136b. The layer serving as the hard mask layer 174 may be formed to have a single-layer structure or a stacked-layer structure using, for example, a simple substance, a nitride, or an alloy containing one or more of tungsten, molybdenum, titanium, and tantalum. Alternatively, the layer serving as the hard mask layer 174 may be formed to have a single-layer structure or a stacked-layer structure using an insulating layer containing one or more of silicon oxide, silicon oxynitride, and silicon nitride.

The layer serving as the resist mask layer 170 may be formed using a photosensitive organic layer or inorganic layer. The layer serving as the resist mask layer 170 may be formed by a spin coating method or the like.

Next, with the use of a photomask, the layer serving as the resist mask layer 170 is irradiated with light. As such light, KrF excimer laser light, ArF excimer laser light, extreme ultraviolet (EUV) light, or the like may be used. Alternatively, a liquid immersion technique may be employed in which a portion between a substrate and a projection lens is filled with liquid (e.g., water) to perform light exposure. Further alternatively, an electron beam or an ion beam may be used instead of the light emitted to the layer serving as the resist mask layer 170. Note that a photomask is not necessary in the case of using an electron beam or an ion beam.

Next, the resist mask layer 170 is formed in such a manner that the substrate 100 is soaked in developer and an exposed region of the layer serving as the resist mask layer 170 is removed or left.

Next, the layer serving as the hard mask layer 174 is etched using the resist mask layer 170, so that the hard mask layer 174 is formed (see FIGS. 3B1 and 3B2).

Note that although the case where the layer serving as the resist mask layer 170 is formed over the layer serving as the hard mask layer 174 is described in this embodiment, one embodiment of the present invention is not limited thereto. For example, a coat layer or the like including an organic material may be formed over the layer serving as the hard mask layer 174 so that the adhesion between the layer serving as the hard mask layer 174 and the layer serving as the resist mask layer 170 is improved. There is a case where the layer serving as the hard mask layer 174 is not necessarily provided as long as minute processing is not particularly required. In such a case, the layer serving as the resist mask layer 170 may be irradiated with light with a g-line or an i-line from a high pressure mercury lamp.

After that, the resist mask layer 170 is removed (see FIGS. 4A1 and 4A2). The resist mask layer 170 may be removed by plasma treatment, chemical liquid treatment, or the like. Preferably, the resist mask layer 170 is removed by plasma ashing.

Next, the oxide semiconductor layer 136a and the oxide semiconductor layer 136b are partly etched using the hard mask layer 174 to form an island-like oxide semiconductor layer 146a and an island-like oxide semiconductor layer 146b (see FIGS. 4B1 and 4B2). At this time, the base insulating film 132 is partly subjected to half etching treatment to be a base insulating film 142.

As a method for partly etching the oxide semiconductor layer 136a and the oxide semiconductor layer 136b, dry etching treatment is preferably employed. The dry etching treatment may be performed in an atmosphere containing methane and a rare gas.

After that, the hard mask layer 174 is removed (see FIGS. 5A1 and 5A2).

Dry etching treatment is preferably employed to remove the hard mask layer 174. For example, in the case where the hard mask layer 174 is a tungsten layer, the dry etching treatment may be performed in an atmosphere containing carbon tetrafluoride and oxygen.

Note that reaction products (also referred to as a rabbit ear) are formed on the side surfaces of the oxide semiconductor layer 146a and the oxide semiconductor layer 146b by the dry etching treatment performed on the oxide semiconductor layer 136a and the oxide semiconductor layer 136b and/or the dry etching treatment performed on the hard mask layer 174. Such reaction products might cause a decrease in step coverage of layers formed in subsequent steps.

Next, the reaction products are removed. At the removal of the reaction products, the base insulating film 142, the oxide semiconductor layer 146a, and the oxide semiconductor layer 146b are slightly etched to be a base insulating film 152, an oxide semiconductor layer 156a, and an oxide semiconductor layer 156b, respectively (see FIGS. 5B1 and 5B2). By once forming and removing the reaction products, the side surfaces of the oxide semiconductor layers 156a and the oxide semiconductor layer 156b can be curved. The side surfaces of the oxide semiconductor layer 156a and the oxide semiconductor layer 156b are curved, so that step coverage of layers and films formed over the oxide semiconductor layer 156a and the oxide semiconductor layer 156b can be improved.

Wet etching treatment or the like may be employed to remove the reaction products. For example, an aqueous solution containing hydrogen fluoride, phosphate, nitric acid, acetic acid, or oxalic acid may be used to perform wet etching treatment. Note that the oxide semiconductor layer 146a and the oxide semiconductor layer 146b easily react with acid; therefore, it is preferable to use an aqueous solution which is sufficiently diluted.

Next, a conductive film 116 is formed (see FIGS. 6A1 and 6A2). The conductive film 116 may be formed using any of the conductive films given as examples of the source electrode 116a and the drain electrode 116b. The conductive film 116 may be formed by a sputtering method, a CVD method, an MBE method, an ALD method, or a PLD method.

Then, the conductive film 116 is processed by a photolithography method or the like, so that the source electrode 116a and the drain electrode 116b are formed. At this time, the base insulating film 152, the oxide semiconductor layer 156a, and the oxide semiconductor layer 156b are slightly etched to be a base insulating film 162, the oxide semiconductor layer 106a, and the oxide semiconductor layer 106b, respectively (see FIGS. 6B1 and 6B2). For the photolithography method or the like, the description on the processing of the oxide semiconductor layer 136a and the oxide semiconductor layer 136b in FIGS. 3B1 and 3B2, FIGS. 4A1, 4A2, 4B1, and 4B2, and FIGS. 5A1 and 5A2 is referred to.

Here, the formation method of the source electrode 116a and the drain electrode 116b having the structure shown in FIG. 2C is described.

First, a conductive film serving as the conductive layer 116a3 and the conductive layer 116b3 is formed. The conductive film may be formed using any of the conductive films given as examples of the source electrode 116a and the drain electrode 116b. The conductive film may be formed by a sputtering method, a CVD method, an MBE method, an ALD method, or a PLD method.

Next, a resist layer is formed over the conductive film by a spin coating method or the like and is irradiated with light using a photomask. Since minute processing is not required for the conductive film, the resist layer may be irradiated with light with a g-line or an i-line from a high pressure mercury lamp. Next, the resist layer is developed to form a resist mask layer. Then, the conductive film is subjected to dry etching treatment using the resist mask layer, so that the conductive layer 116a3 and the conductive layer 116b3 are formed.

After that, the resist mask layer is removed by plasma ashing or the like. At this time, in some cases, oxide layers of a metal used for the conductive film are formed on the surfaces of the conductive layer 116a3 and the conductive layer 116b3. It is preferable to remove the oxide layers formed on the surfaces of the conductive layer 116a3 and the conductive layer 116b3 because there is a concern that a contact resistance is increased when the oxide layers are formed on the surfaces thereof. In the case where the oxide layers formed on the surfaces of the conductive layer 116a3 and the conductive layer 116b3 are each an oxide of tungsten, molybdenum, chromium, or the like, the oxide layers can be removed in some cases by treatment with water (approximately at a temperature higher than or equal to 10° C. and lower than 25° C.) or warm water (at a temperature higher than or equal to 25° C.

and lower than or equal to 100° C., preferably higher than or equal to 40° C. and lower than or equal to 60° C.).

Next, a conductive film serving as the conductive layer 116a4 and the conductive layer 116b4 is formed. The conductive film may be formed using any of the conductive films given as examples of the source electrode 116a and the drain electrode 116b. The conductive film may be formed by a sputtering method, a CVD method, an MBE method, an ALD method, or a PLD method.

Next, a resist layer is formed over the conductive film by a spin coating method or the like. Note that a coat layer or the like including an organic material may be formed as a base of the resist layer. Next, with the use of a photomask, the resist layer is irradiated with light. Minute processing is required for the conductive film in some cases; therefore, KrF excimer laser light, ArF excimer laser light, extreme ultraviolet (EUV) light, or the like may be used. Alternatively, a liquid immersion technique may be employed. Further alternatively, an electron beam or an ion beam may be used instead of the light emitted to the resist layer. Note that a photomask is not necessary in the case of using an electron beam or an ion beam. Next, the resist layer is developed, so that a resist mask layer is formed. Then, the conductive film is subjected to dry etching using the resist mask layer, so that the conductive layer 116a4 and the conductive layer 116b4 are formed.

After that, the resist mask layer is removed by plasma ashing or the like. Through the above steps, the source electrode 116a including the conductive layer 116a3 and the conductive layer 116a4 and the drain electrode 116b including the conductive layer 116b3 and the conductive layer 116b4 can be formed.

Note that in the case where a tungsten layer is used as the conductive layer 116a3 and the conductive layer 116b3, cross sections thereof are observed by a scanning transmission electron microscope (STEM) so that whether or not an oxide is formed on the surface can be observed. Note that the cross sections were observed by STEM, using an Ultra-thin Film Evaluation System HD-2300 manufactured by Hitachi High-Technologies Corporation.

Figure 20A:
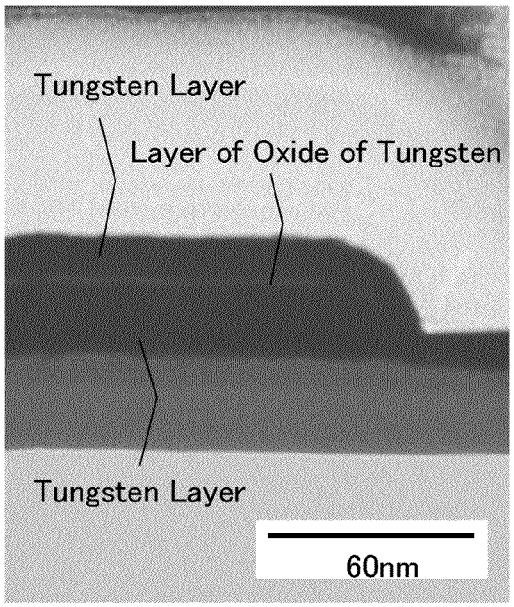
FIGS. 20A to 20D are STEM images.
Figure 20B:
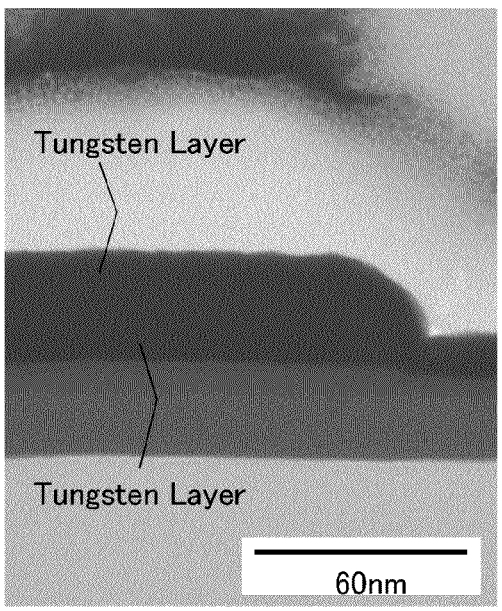
Figure 20C:
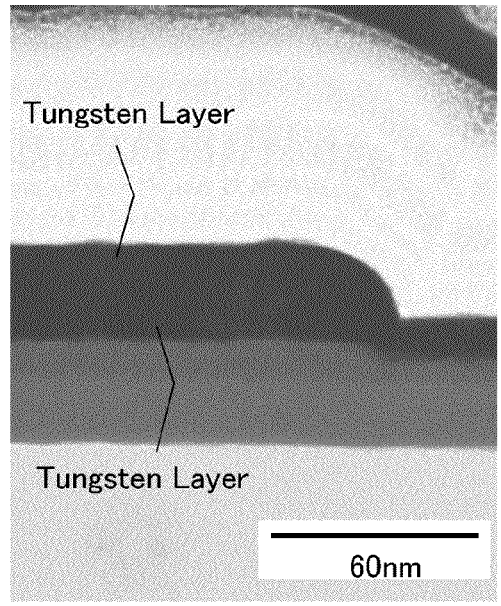
Figure 20D:
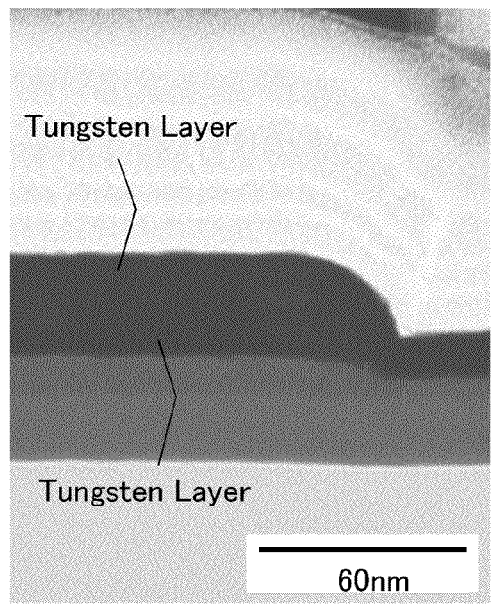

A cross-sectional STEM image in the case where the oxide formed on the surface of the conductive layer 116a3 or the conductive layer 116b3 is not removed is shown in FIG. 20A, a cross-sectional STEM image in the case where treatment with pure water is performed approximately at 21° C. for 3 minutes is shown in FIG. 20B, a cross-sectional STEM image in the case where treatment with pure water is performed approximately at 40° C. for 3 minutes is shown in FIG. 20C, and a cross-sectional STEM image in the case where treatment with pure water is performed approximately at 60° C. for 3 minutes is shown in FIG. 20D.

According to FIG. 20A, formation of a layer different from the tungsten layers can be observed between the tungsten layers. According to FIG. 20B, formation of a layer different from the tungsten layers can be slightly observed between the tungsten layers and it is observed that such a layer is thinner than the layer observed from the cross-sectional STEM image in FIG. 20A. According to FIGS. 20C and 20D, formation of a layer different from the tungsten layers cannot be observed between the tungsten layers. Note that the layers different from the tungsten layers are observed here to be oxides of tungsten by energy dispersive X-ray spectroscopy (EDX).

Thus, removal of the oxide layers formed on the surface of the tungsten layer by treatment with water or warm water was observed.

Next, an oxide semiconductor layer 136c, an insulating film 122, and a conductive film 114 are formed in this order (see FIGS. 7A1 and 7A2). The oxide semiconductor layer 136c can be formed using any of the oxide semiconductor layers given as examples of the oxide semiconductor layer 106c. The oxide semiconductor layer 136c may be formed by a sputtering method, a CVD method, an MBE method, an ALD method, or a PLD method. The insulating film 122 may be formed using any of the insulating films given as examples of the insulating film 112. The insulating film 122 may be formed by a sputtering method, a CVD method, an MBE method, an ALD method, or a PLD method. The conductive film 114 may be formed using any of the conductive films given as examples of the gate electrode 104. The conductive film 114 may be formed by a sputtering method, a CVD method, an MBE method, an ALD method, or a PLD method.

Note that first heat treatment is preferably performed after the formation of the oxide semiconductor layer 136c. The first heat treatment may be performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor layer 106a, the oxide semiconductor layer 106b, and the oxide semiconductor layer 136c can be improved, and in addition, impurities such as hydrogen and water can be removed from the oxide semiconductor layer 106a, the oxide semiconductor layer 106b, and the oxide semiconductor layer 136c.

Next, the conductive film 114 is processed by a photolithography method or the like, so that the gate electrode 104 is formed. Part of the insulating film 122 is etched, so that the gate insulating film 112 is formed. Furthermore, part of the oxide semiconductor layer 136c is etched, so that the oxide semiconductor layer 106c is formed. For the photolithography method or the like, the description on the processing of the oxide semiconductor layer 136a and the oxide semiconductor layer 136b in FIGS. 3B1 and 3B2, FIGS. 4A1, 4A2, 4B1, and 4B2, and FIGS. 5A1 and 5A2 is referred to.

Next, the protective insulating film 108 is formed. The protective insulating film 108 may be formed using any of the insulating films given as examples of the protective insulating film 108. The protective insulating film 108 may be formed by a sputtering method, a CVD method, an MBE method, an ALD method, or a PLD method.

Next, the protective insulating film 118 is formed (see FIGS. 8A1 and 8A2). The protective insulating film 118 may be formed using any of the insulating films given as examples of the protective insulating film 118. The protective insulating film 118 may be formed by a sputtering method, a CVD method, an MBE method, an ALD method, or a PLD method.

Next, second heat treatment is preferably performed. The second heat treatment may be performed under conditions selected from the conditions shown in the first heat treatment or may be performed at a temperature lower than that for the first heat treatment. The second heat treatment can also serve as the first heat treatment.

Through the above steps, the transistor in FIGS. 1A to 1C can be manufactured.

<Transistor Structure (2)>

Next, an example of a top-gate and top-contact transistor having a structure different from that of the transistor structure (1) is described.

Figure 9A:
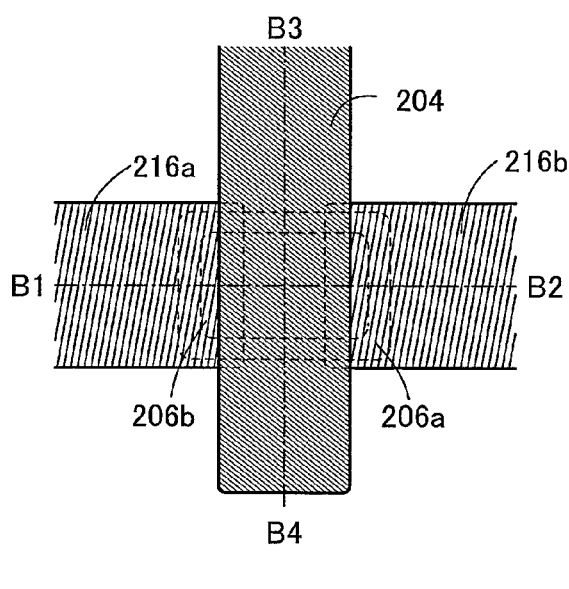
FIGS. 9A to 9C are a top view and cross-sectional views illustrating an example of a transistor of one embodiment of the present invention.
Figure 9C:
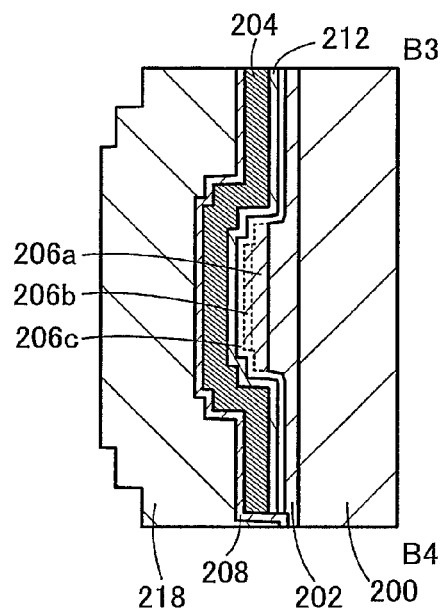
Figure 9B:
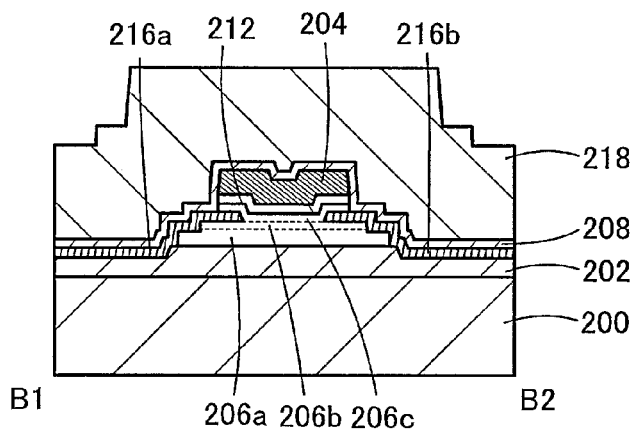

FIGS. 9A to 9C are a top view and cross-sectional views of the transistor. FIG. 9A is a top view of the transistor. FIG. 9B is the cross-sectional view taken along dashed-dotted line B1-B2 in FIG. 9A. FIG. 9C is the cross-sectional view taken along dashed-dotted line B3-B4 in FIG. 9A.

A transistor in FIG. 9B which is the cross-sectional view in a channel length direction includes a base insulating film 202 over a substrate 200, an oxide semiconductor layer 206a over the base insulating film 202, an oxide semiconductor layer 206b over the oxide semiconductor layer 206a, a source electrode 216a and a drain electrode 216b over the oxide semiconductor layer 206b, an oxide semiconductor layer 206c over the oxide semiconductor layer 206b, and the source electrode 216a and the drain electrode 216b, a gate insulating film 212 over the oxide semiconductor layer 206c, and a gate electrode 204 over the gate insulating film 212. Note that preferably, a protective insulating film 208 is provided over the source electrode 216a and the drain electrode 216b, the oxide semiconductor layer 206c, the gate insulating film 212, and the gate electrode 204; and a protective insulating film 218 is provided over the protective insulating film 208. Note that the transistor does not necessarily include the base insulating film 202.

Note that the stacking order of the protective insulating film 208 and the protective insulating film 218 may be reversed.

Note that in FIG. 9C which is the cross-sectional view in a channel width direction, the electric field of the gate electrode 204 is also applied to the lateral side of the oxide semiconductor layer 206b. For example, in the case where the channel width of the transistor is less than or equal to 100 nm, preferably less than or equal to 60 nm, further preferably less than or equal to 40 nm, a high electric field is applied to the lateral side of the oxide semiconductor layer 206b. Accordingly, the on-state characteristics of the transistor (e.g., current when the transistor is turned on or field-effect mobility) are increased and the off-state characteristics thereof (e.g., current when the transistor is turned off) are decreased. Furthermore, a punch-through phenomenon can be suppressed; thus, normally-off electrical characteristics can be obtained even in a transistor with a small channel length. Thus, the transistor has excellent electrical characteristics.

Note that in FIG. 9A which is the top view, the outer edge portion of the oxide semiconductor layer 206b is located on the inner side of that of the oxide semiconductor layer 206a. Therefore, it is possible to improve step coverage of the layers and films formed over the stacked film including the oxide semiconductor layer 206a and the oxide semiconductor layer 206b, such as the source electrode 216a and the drain electrode 216b, the oxide semiconductor layer 206c, the gate insulating film 212, the gate electrode 204, the protective insulating film 208, and the protective insulating film 218. Thus, in the transistor, a decrease in yield due to step coverage is less likely to occur. However, the yield of a transistor is not necessarily improved in accordance with this structure. For example, the stacked film including the oxide semiconductor layer 206a and the oxide semiconductor layer 206b may have a step from the center toward the outer portion so that the step coverage of the transistor is improved.

Note that as illustrated in FIG. 9A, the gate electrode 204 is provided such that the edge of the oxide semiconductor layer 206b is located on the inner side of the edge of the gate electrode 204 in the top view. With such a structure, when light irradiation is performed from the gate electrode 204 side, generation of carriers in the oxide semiconductor layer 206b due to light can be suppressed. In other words, the gate electrode 204 functions as a light-blocking film. Note that the oxide semiconductor layer 206b may be provided outside the gate electrode 204.

For the substrate 200, the description of the substrate 100 is referred to. For the base insulating film 202, the description of the base insulating film 102 is referred to. For the oxide semiconductor layer 206a, the description of the oxide semiconductor layer 106a is referred to. For the oxide semiconductor layer 206b, the description of the oxide semiconductor layer 106b is referred to. For the source electrode 216a and the drain electrode 216b, the description of the source electrode 116a and the drain electrode 116b is referred to. For the oxide semiconductor layer 206c, the description of the oxide semiconductor layer 106c is referred to. For the gate insulating film 212, the description of the gate insulating film 112 is referred to. For the gate electrode 204, the description of the gate electrode 104 is referred to. For the protective insulating film 208, the description of the protective insulating film 108 is referred to. For the protective insulating film 218, the description of the protective insulating film 118 is referred to.

Thus, the difference between the transistor structure (2) and the transistor structure (1) lies only in the shapes of the oxide semiconductor layer 206a and the oxide semiconductor layer 206b and the shapes of the oxide semiconductor layer 106a and the oxide semiconductor layer 106b. Accordingly, for the transistor structure (2), the description of the transistor structure (1) can be referred to.

<Method for Manufacturing Transistor Structure (2)>

An example of a method for manufacturing the transistor structure (2) is described below.

Cross-sectional views corresponding to FIGS. 9B and 9C are shown in FIGS. 10A1, 10A2, 10B1, and 10B2, FIGS. 11A1, 11A2, 11B1, and 11B2, FIGS. 12A1, 12A2, 12B1, and 12B2, FIGS. 13A1, 13A2, 13B1, and 13B2, FIGS. 14A1, 14A2, 14B1, and 14B2, and FIGS. 15A1, 15A2, 15B1, and 15B2.

First, the substrate 200 is prepared.

Next, a base insulating film 232 is formed. For the base insulating film 232, the description of the film formation method of the base insulating film 132 is referred to.

Then, in order to planarize the surface of the base insulating film 232, CMP treatment may be performed. By CMP treatment, Ra of the base insulating film 232 is preferably less than or equal to 1 nm, further preferably less than or equal to 0.3 nm, still further preferably less than or equal to 0.1 nm.

Then, oxygen ions may be added into the base insulating film 232 so that an insulating film containing excess oxygen can be formed. The addition of oxygen ions is preferably performed by an ion-implantation method at an acceleration voltage of 2 kV to 100 kV and at a dose of $5 \times 10^{14}$ ions/cm$^2$ to $5 \times 10^{16}$ ions/cm$^2$, for example.

Next, an oxide semiconductor layer 236a and an oxide semiconductor layer 236b are formed in this order (see FIGS. 10A1 and 10A2). For the oxide semiconductor layer 236a and the oxide semiconductor layer 236b, the description of the film formation method of the oxide semiconductor layer 136a and the oxide semiconductor layer 136b is referred to.

Next, a layer serving as a hard mask layer 274 and a layer serving as a resist mask layer 270 are formed over the oxide semiconductor layer 236b.

Note that for the layer serving as the hard mask layer 274, the description of the film formation method of the layer serving as the hard mask layer 174 is referred to.

Note that for the layer serving as the resist mask layer 270, the description of the film formation method of the layer serving as the resist mask layer 170 is referred to.

Next, the layer serving as the hard mask layer 274 and the layer serving as the resist mask layer 270 are processed by a photolithography method or the like, so that the hard mask layer 274 and the resist mask layer 270 are formed (see FIGS. 10B1 and 10B2).

Then, the oxide semiconductor layer 236a and the oxide semiconductor layer 236b are partly etched using the hard mask layer 274 and the resist mask layer 270 to form an island-like oxide semiconductor layer 246a and an island-like oxide semiconductor layer 246b (see FIGS. 11A1 and 11A2). At this time, the base insulating film 232 is partly subjected to half etching treatment to be a base insulating film 242.

For the method for partly etching the oxide semiconductor layer 236a and the oxide semiconductor layer 236b, the description of the method for partly etching the oxide semiconductor layer 136a and the oxide semiconductor layer 136b is referred to.

Next, the hard mask layer 274 and the resist mask layer 270 are reduced, so that a hard mask layer 284 and a resist mask layer 280 are formed, respectively (see FIGS. 11B1 and 11B2). The hard mask layer 284 and the resist mask layer 280 may be formed in such a manner that the resist mask layer 270 is reduced by, for example, plasma ashing, so that the resist mask layer 280 is formed, and then the hard mask layer 274 is etched using the resist mask layer 280, so that the hard mask layer 284 is formed.

Then, the stacked film including the oxide semiconductor layer 246a and the oxide semiconductor layer 246b is subjected to half etching treatment using the hard mask layer 284 and the resist mask layer 280 to form an oxide semiconductor layer 256a and an oxide semiconductor layer 256b (see FIGS. 12A1 and 12A2). At this time, the base insulating film 242 is partly subjected to half etching treatment to be a base insulating film 252.

Next, the hard mask layer 284 and the resist mask layer 280 are removed (see FIGS. 12B1 and 12B2).

Note that for removal of the resist mask layer 280, the description of the method for removing the resist mask layer 170 is referred to. For removal of the hard mask layer 284, the description of the method for removing the hard mask layer 174 is referred to.

Note that reaction products are formed on the side surfaces of the oxide semiconductor layer 256a and the oxide semiconductor layer 256b by the dry etching treatment performed on the oxide semiconductor layer 236a and the oxide semiconductor layer 236b, the dry etching treatment performed on the oxide semiconductor layer 246a and the oxide semiconductor layer 246b, and/or the dry etching treatment performed on the hard mask layer 284. Such reaction products might cause a decrease in step coverage of layers formed in subsequent steps.

Next, the reaction products are removed. At the removal of the reaction products, the base insulating film 252, the oxide semiconductor layer 256a, and the oxide semiconductor layer 256b are slightly etched to be a base insulating film 262, an oxide semiconductor layer 266a, and an oxide semiconductor layer 266b, respectively (see FIGS. 13A1 and 13A2). By once forming and removing the reaction products, the side surfaces of the oxide semiconductor layers 266a and the oxide semiconductor layer 266b can be curved. The side surfaces of the oxide semiconductor layer 266a and the oxide semiconductor layer 266b are curved, so that step coverage of layers and films formed over the oxide semiconductor layer 266a and the oxide semiconductor layer 266b can be improved.

Wet etching treatment or the like may be employed to remove the reaction products. For example, an aqueous solution containing hydrogen fluoride, phosphate, nitric acid, acetic acid, or oxalic acid may be used to perform wet etching treatment. Note that the oxide semiconductor layer 256a and the oxide semiconductor layer 256b easily react with acid; therefore, it is preferable to use an aqueous solution which is sufficiently diluted.

Next, a conductive film 216 is formed (see FIGS. 13B1 and 13B2). For the conductive film 216, the description of the film formation method of the conductive film 116 is referred to.

Then, the conductive film 216 is processed by a photolithography method or the like, so that the source electrode 216a and the drain electrode 216b are formed. At this time, the base insulating film 262, the oxide semiconductor layer 266a, and the oxide semiconductor layer 266b are slightly etched to be a base insulating film 272, the oxide semiconductor layer 206a, and the oxide semiconductor layer 206b, respectively (see FIGS. 14A1 and 14A2).

Next, an oxide semiconductor layer 236c, an insulating film 222, and a conductive film 214 are formed in this order (see FIGS. 14B1 and 14B2). For the oxide semiconductor layer 236c, the description of the film formation method of the oxide semiconductor layer 136c is referred to. For the insulating film 222, the description of the film formation method of the insulating film 122 is referred to. For the conductive film 214, the description of the film formation method of the conductive film 114 is referred to.

Note that first heat treatment is preferably performed after the formation of the oxide semiconductor layer 236c. For the first heat treatment, the description of the first heat treatment described in the method for manufacturing the transistor structure (1) is referred to.

Next, the conductive film 214 is processed by a photolithography method or the like, so that the gate electrode 204 is formed. Part of the insulating film 222 is etched, so that the gate insulating film 212 is formed. Furthermore, part of the oxide semiconductor layer 236c is etched, so that the oxide semiconductor layer 206c is formed (see FIGS. 15A1 and 15A2).

Then, the protective insulating film 208 is formed. For the protective insulating film 208, the description of the film formation method of the protective insulating film 108 is referred to.

Next, the protective insulating film 218 is formed (see FIGS. 15B1 and 15B2). For the protective insulating film 218, the description of the film formation method of the protective insulating film 118 is referred to.

Next, second heat treatment is preferably performed. The second heat treatment may be performed under conditions selected from the conditions shown in the first heat treatment or may be performed at a temperature lower than that for the first heat treatment. The second heat treatment can also serve as the first heat treatment.

Through the above steps, the transistor in FIGS. 9A to 9C can be manufactured.

<Application Product>

Application products using the above transistor are described below.

The above transistor can be used for various purposes such as a memory, a CPU, and a display device, for example.

<CPU>

Figure 16A:
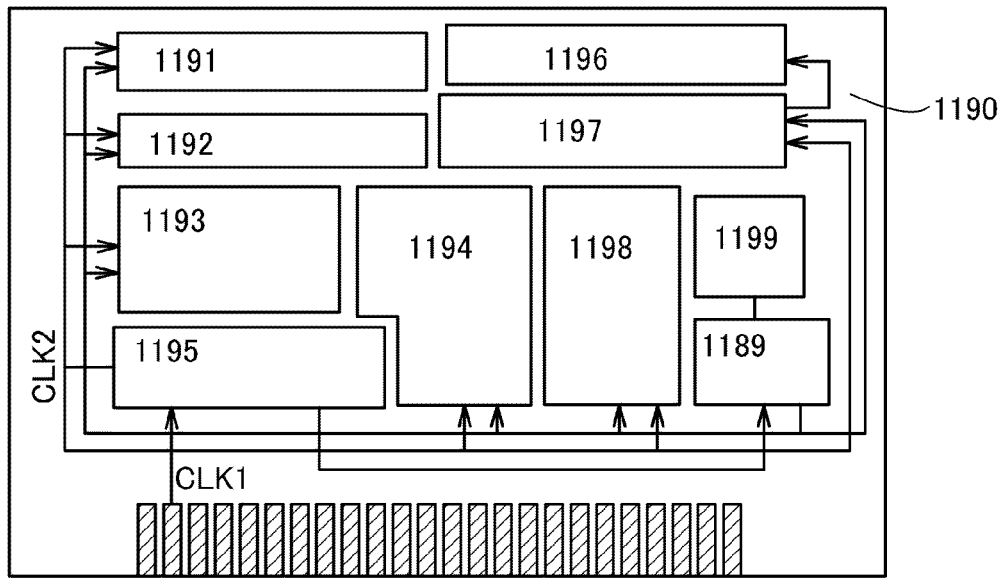
FIGS. 16A to 16C are block diagrams illustrating an example of a CPU of one embodiment of the present invention.
Figure 16B:
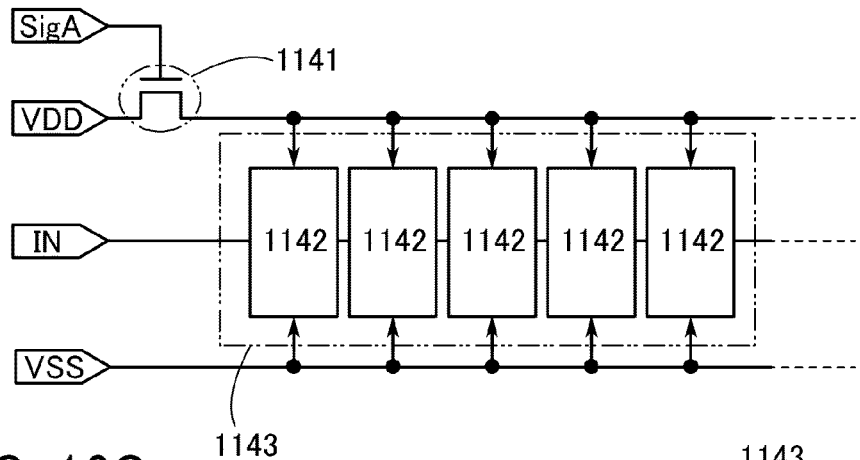
Figure 16C:
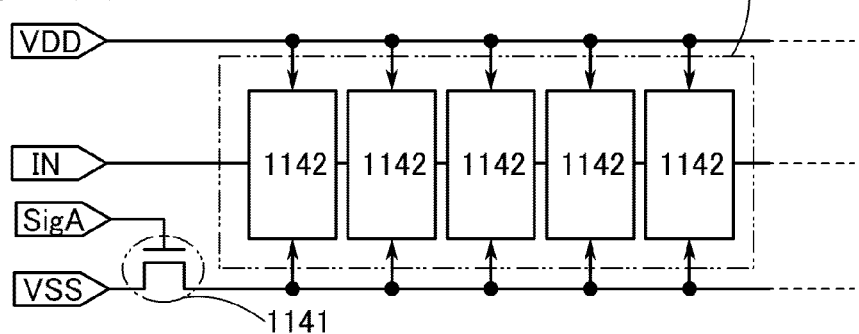

FIGS. 16A to 16C are block diagrams illustrating a specific configuration of a CPU at least partly including the above transistor.

The CPU in FIG. 16A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 16A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU in FIG. 16A, a memory cell is provided in the register 1196. As the memory cell of the register 1196, the above transistor can be used.

In the CPU in FIG. 16A, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 16B or FIG. 16C. Circuits illustrated in FIGS. 16B and 16C are described below.

FIGS. 16B and 16C each illustrate a memory device in which the above transistor is used as a switching element which controls supply of a power supply potential to a memory cell.

The memory device in FIG. 16B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high-level power supply potential VDD via the switching element 1141. Furthermore, each of the memory cells 1142 included in the memory cell group 1143 is supplied with a potential of a signal IN and the low-level power supply potential VSS.

In FIG. 16B, the above transistor is used as the switching element 1141, and the switching of the transistor is controlled by a signal SigA supplied to a gate electrode layer thereof.

Note that FIG. 16B illustrates the configuration in which the switching element 1141 includes only one transistor; however, one of embodiment of the present invention is not particularly limited to such configuration and the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 16B, the switching element 1141 may control the supply of the low-level power supply potential VSS.

In FIG. 16C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be retained even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, the above transistor can also be applied to an LSI such as a digital signal processor (DSP), a custom LSI, or a field programmable gate array (FPGA).

<Installation Example>

Figure 17A:
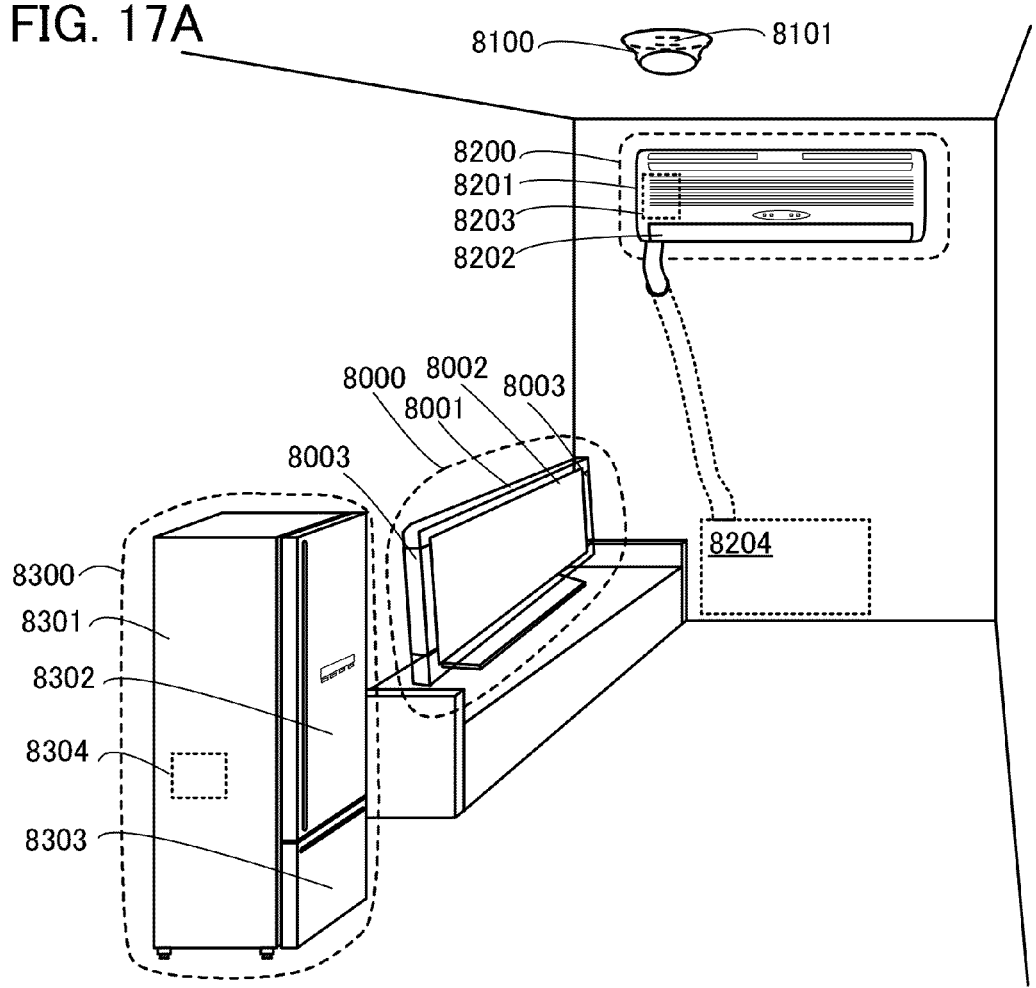
FIGS. 17A to 17C each illustrate an example of an electronic appliance of one embodiment of the present invention.

In a television set 8000 in FIG. 17A, a display portion 8002 is incorporated in a housing 8001. The display portion 8002 displays an image and a speaker portion 8003 can output sound.

The television set 8000 may be provided with a receiver, a modem, and the like. With the receiver, the television set 8000 can receive general television broadcasting. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a memory or a CPU for performing information communication. The above memory or CPU can be used for the television set 8000.

In FIG. 17A, an alarm device 8100 is a residential fire alarm, which includes a sensor portion and a microcomputer 8101. Note that the microcomputer 8101 includes a CPU in which the above transistor is used.

In FIG. 17A, an air conditioner which includes an indoor unit 8200 and an outdoor unit 8204 includes the CPU in which the above transistor is used. Specifically, the indoor unit 8200 includes a housing 8201, an air outlet 8202, a CPU 8203, and the like. Although the CPU 8203 is provided in the indoor unit 8200 in FIG. 17A, the CPU 8203 may be provided in the outdoor unit 8204. Alternatively, the CPU 8203 may be provided in both the indoor unit 8200 and the outdoor unit 8204. When the air conditioner includes the CPU in which the above transistor is used, a reduction in power consumption of the air conditioner can be achieved.

In FIG. 17A, an electric refrigerator-freezer 8300 includes the CPU in which the above transistor is used. Specifically, the electric refrigerator-freezer 8300 includes a housing 8301, a door for a refrigerator 8302, a door for a freezer 8303, a CPU 8304, and the like. In FIG. 17A, the CPU 8304 is provided in the housing 8301. When the electric refrigerator-freezer 8300 includes the CPU in which the above transistor is used, a reduction in power consumption of the electric refrigerator-freezer 8300 can be achieved.

Figure 17B:
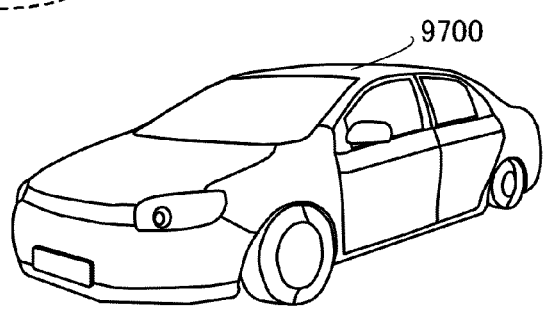
Figure 17C:
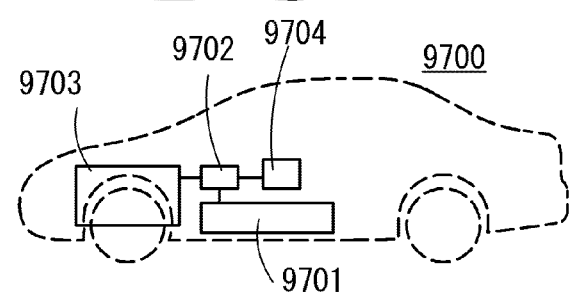

FIGS. 17B and 17C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the electric vehicle 9700 includes the CPU in which the above transistor is used, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment shows an example of a basic principle. Thus, part of this embodiment can be freely combined with, applied to, or replaced with another part of this embodiment.

Example 1

In this example, a cross section of a reaction product, which was formed when a stacked film including a first oxide semiconductor layer and a second oxide semiconductor layer was processed by a photolithography method, was observed by STEM. Note that the reaction product was removed.

A method for forming samples is described below.

A silicon wafer was used as a substrate. Next, the silicon wafer was processed at 950° C. in an atmosphere containing hydrogen chloride and oxygen to form a 100-nm-thick silicon oxide film. Then, a 300-nm-thick silicon oxynitride film was formed. The silicon oxynitride film was planarized by CMP treatment so that Ra of a surface thereof is less than or equal to 0.2 nm.

Next, as the first oxide semiconductor layer, a 20-nm-thick In—Ga—Zn oxide layer was formed. The first oxide semiconductor layer was formed by a sputtering method using an In—Ga—Zn oxide (an atomic ratio of In to Ga and Zn being 1:3:2) target.

Next, as the second oxide semiconductor layer, a 15-nm-thick In—Ga—Zn oxide layer was formed. The second oxide semiconductor layer was formed by a sputtering method using an In—Ga—Zn oxide (an atomic ratio of In to Ga and Zn being 1:1:1) target.

Next, a resist layer was formed by a spin coating method and was partly exposed to an electron beam. Then, the resist layer was developed to form a resist mask layer. After that, the first oxide semiconductor layer and the second oxide semiconductor layer were subjected to dry etching treatment using the resist mask layer. The dry etching treatment was performed under the following conditions: the flow rates of methane and argon were 16 sccm and 32 sccm, respectively, the pressure was 1.0 Pa, the ICP power was 600 W, and the bias power was 100 W. Note that the substrate temperature was set at 70° C.

Then, the resist mask layer was removed by plasma ashing.

Figure 18A:
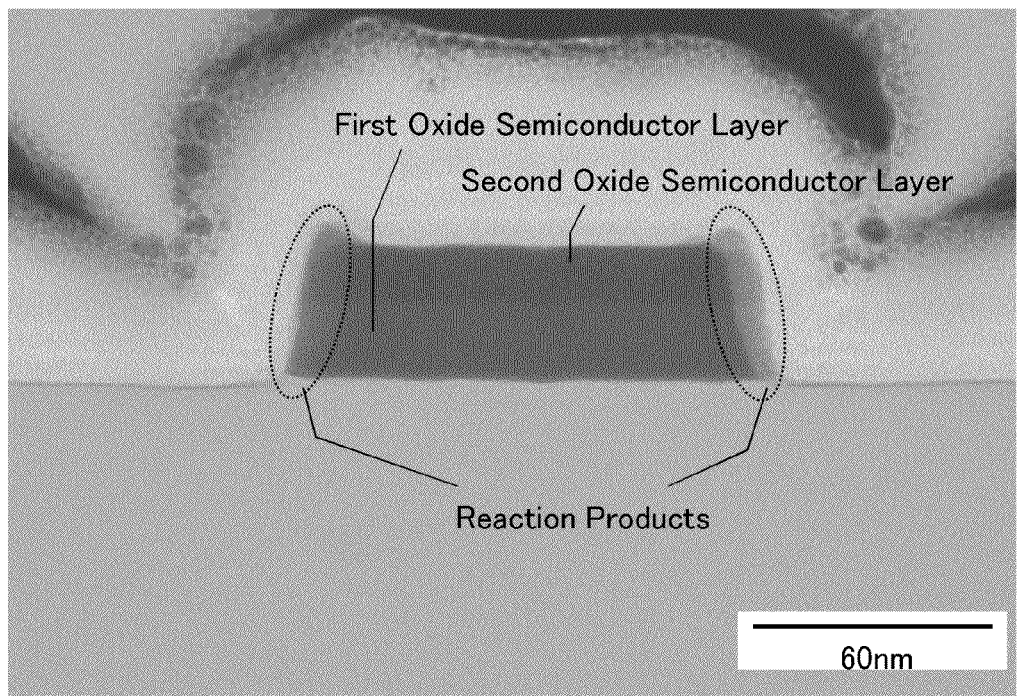
FIGS. 18A and 18B are STEM images.

Next, cross sections of the samples were observed by STEM (see FIG. 18A). The cross sections were observed by STEM, using an Ultra-thin Film Evaluation System HD-2300 manufactured by Hitachi High-Technologies Corporation.

According to FIG. 18A, reaction products were observed to be formed by dry etching treatment on the side surfaces of the first oxide semiconductor layer and the second oxide semiconductor layer.

Next, treatment with ozone water and treatment with diluted hydrofluoric acid were performed on the samples. The concentration of the diluted hydrofluoric acid was set to 0.003 wt %.

Figure 18B:
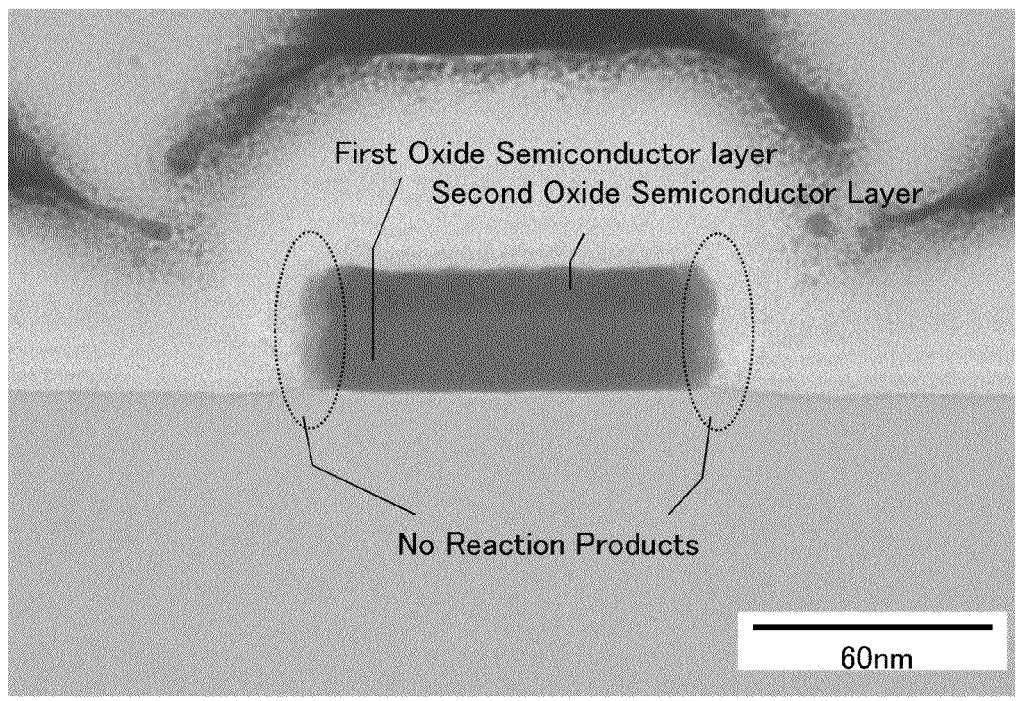

Next, cross sections of the samples, which were subjected to the treatment with ozone water and the treatment with diluted hydrofluoric acid, were observed by STEM (see FIG. 18B).

It was found from a cross-sectional STEM image in FIG. 18B, which is compared with that in FIG. 18A, that the reaction products on the side surfaces of the first oxide semiconductor layer and the second oxide semiconductor layer were removed.

Moreover, it was found from the cross-sectional STEM image in FIG. 18B that the side surfaces of the first oxide semiconductor layer and the second oxide semiconductor layer are curved. The side surfaces of the first oxide semiconductor layer and the second oxide semiconductor layer are curved, so that step coverage of layers and films formed over the first oxide semiconductor layer and the second oxide semiconductor layer can be improved.

Example 2

In this example, a transistor was formed and a cross-sectional shape thereof was observed.

The transistor had the structure illustrated in FIGS. 1A to 1C. Therefore, for the structure of the transistor and the fabricating method thereof that are described below, FIGS. 1A to 1C, FIGS. 2A to 2C, FIGS. 3A1, 3A2, 3B1, and 3B2, FIGS. 4A1, 4A2, 4B1, and 4B2, FIGS. 5A1, 5A2, 5B1, and 5B2, FIGS. 6A1, 6A2, 6B1, and 6B2, and FIGS. 7A1, 7A2, 7B1, and 7B2 are referred to.

A method for fabricating the transistor is described below.

A silicon wafer was used as the substrate 100. Next, the base insulating film 132 was formed. Then, the silicon wafer was processed at 950° C. in an atmosphere containing hydrogen chloride and oxygen to form a 100-nm-thick silicon oxide film. Then, a 300-nm-thick silicon oxynitride film was formed. The silicon oxynitride film was planarized by CMP treatment so that Ra of a surface thereof is less than or equal to 0.2 nm.

Next, as the oxide semiconductor layer 136a, a 20-nm-thick In—Ga—Zn oxide layer was formed. The oxide semiconductor layer 136a was formed by a sputtering method using an In—Ga—Zn oxide (an atomic ratio of In to Ga and Zn being 1:3:2) target.

Next, as the oxide semiconductor layer 136b, a 15-nm-thick In—Ga—Zn oxide layer was formed. The oxide semiconductor layer 136b was formed by a sputtering method using an In—Ga—Zn oxide (an atomic ratio of In to Ga and Zn being 1:1:1) target (see FIGS. 3A1 and 3A2).

Next, a 5-nm-thick tungsten layer was formed as a layer serving as the hard mask layer 174. Then, a 20-nm-thick coat layer including an organic material was formed over the layer serving as the hard mask layer 174. After that, a 100-nm-thick layer serving as the resist mask layer 170 was formed.

Next, the resist mask layer 170 was formed in such a manner that the layer serving as the resist mask layer 170 was partly exposed to an electron beam and the substrate 100 was soaked in developer.

Next, the layer serving as the hard mask layer 174 and the coat layer were subjected to dry etching treatment using the resist mask layer 170, so that the hard mask layer 174 was formed (see FIGS. 3B1 and 3B2). The dry etching treatment was performed under the following conditions: in a first step, the flow rate of carbon tetrafluoride was 100 sccm, the pressure was 0.67 Pa, the ICP power was 2000 W, and the bias power was 50 W; and in a second step, the flow rates of carbon tetrafluoride and oxygen were 60 sccm and 40 sccm, respectively, the pressure was 2.0 Pa, the ICP power was 1000 W, and the bias power was 25 W. Note that the substrate temperature was set at −10° C.

Next, the oxide semiconductor layer 136a and the oxide semiconductor layer 136b were partly subjected to dry etching treatment using the hard mask layer 174 and the resist mask layer 170, so that the base insulating film 142, the oxide semiconductor layer 146a, and the oxide semiconductor layer 146b were formed. The dry etching treatment was performed under the following conditions: the flow rates of methane and argon were 16 sccm and 32 sccm, respectively, the pressure was 1.0 Pa, the ICP power was 600 W, and the bias power was 100 W. Note that the substrate temperature was set at 70° C.

Then, the resist mask layer 170 and the coat layer were removed by plasma ashing. After that, the hard mask layer 174 was removed by dry etching treatment (see FIGS. 5A1 and 5A2). The dry etching treatment was performed under the following conditions: the flow rates of carbon tetrafluoride and oxygen were 60 sccm and 40 sccm, respectively, the pressure was 2.0 Pa, the ICP power was 1000 W, and the bias power was 25 W. Note that the substrate temperature was set at −10° C.

Next, treatment with ozone water and treatment with diluted hydrofluoric acid were performed. The concentration of the hydrofluoric acid was set to 0.003 wt %. In such a manner, the base insulating film 152, the oxide semiconductor layer 156a, and the oxide semiconductor layer 156b were formed (see FIGS. 5B1 and 5B2).

Next, as the conductive film 116, a 10-nm-thick tungsten film was formed (see FIGS. 6A1 and 6A2).

Next, a coat layer including an organic material was formed. Then, a 100-nm-thick resist layer was formed. The resist layer was partly exposed to light to form a resist mask layer. After that, the conductive film 116 and the coat layer were subjected to dry etching treatment using the resist mask layer, so that the source electrode 116a and the drain electrode 116b were formed. At the time of the formation of the source electrode 116a and the drain electrode 116b, the base insulating film 162, the oxide semiconductor layer 106a, and the oxide semiconductor layer 106b were formed (see FIGS. 6B1 and 6B2). The dry etching treatment was performed under the following conditions: in a first step, the flow rate of carbon tetrafluoride was 100 sccm, the pressure was 0.67 Pa, the ICP power was 2000 W, and the bias power was 50 W; and in a second step, the flow rates of carbon tetrafluoride and oxygen were 60 sccm and 40 sccm, respectively, the pressure was 2.0 Pa, the ICP power was 1000 W, and the bias power was 25 W. Note that the substrate temperature was set at −10° C.

Then, the resist mask layer and the coat layer were removed by plasma ashing.

Next, as the oxide semiconductor layer 136c, a 10-nm-thick In—Ga—Zn oxide layer was formed. The oxide semiconductor layer 136c was formed by a sputtering method using an In—Ga—Zn oxide (an atomic ratio of In to Ga and Zn being 1:3:2) target.

Next, a 10-nm-thick silicon oxynitride film was formed as the insulating film 122. Then, a stacked film in which a 10-nm-thick tantalum nitride layer and a 10-nm-thick tungsten layer were formed in this order was formed as the conductive film 114 (see FIGS. 7A1 and 7A2).

Next, a 150-nm-thick resist layer was formed. The resist layer was partly exposed to light to form a resist mask layer. Then, the conductive film 114 was subjected to dry etching treatment using the resist mask layer, so that the gate electrode 104 was formed. The dry etching treatment was performed under the following conditions: in a first step, the flow rates of carbon tetrafluoride, oxygen, and chlorine were 55 sccm, 55 sccm, and 45 sccm, respectively, the pressure was 0.67 Pa, the ICP power was 3000 W, and the bias power was 110 W; and in a second step, the flow rates of boron trichloride and chlorine were 150 sccm and 50 sccm, respectively, the pressure was 0.67 Pa, the ICP power was 1000 W, and the bias power was 50 W. Note that the substrate temperature was set at 40° C.

Next, the insulating film 122 was subjected to dry etching treatment using the resist mask layer and the gate electrode 104, so that the gate insulating film 112 was formed. The dry etching treatment was performed under the following conditions: the flow rates of helium and trifluoromethane were 144 sccm and 56 sccm, respectively, the pressure was 7.5 Pa, the ICP power was 25 W, and the bias power was 425 W.

Next, the oxide semiconductor layer 136c was subjected to dry etching treatment using the resist mask layer, the gate electrode 104, and the gate insulating film 112, so that the oxide semiconductor layer 106c was formed. Here, the base insulating film 102 as well as the oxide semiconductor layer 106c was formed (see FIGS. 7B1 and 7B2). The dry etching treatment was performed under the following conditions: the flow rates of methane and argon were 16 sccm and 32 sccm, respectively, the pressure was 1.0 Pa, the ICP power was 600 W, and the bias power was 100 W. Note that the substrate temperature was set at 70° C.

Then, the resist mask layer was removed by plasma ashing.

The transistor was fabricated in the above manner, and cross sections in the channel width direction (the direction of the line A3-A4 in FIG. 1A) and the channel length direction (the direction of the line A1-A2 in FIG. 1A) were observed by STEM. FIG. 19A shows a cross-sectional STEM image in the channel width direction, and FIG. 19B shows a cross-sectional STEM image in the channel length direction.

According to FIGS. 19A and 19B, it was found that the fabrication method described in this example enables fabrication of an extremely miniaturized transistor with a channel width of approximately 80 nm and a channel length of approximately 55 nm. Moreover, it was found that the transistor described in this example had high step coverage.

Note that as shown in FIG. 19B, a reaction product is in some cases formed so as to cover the surface of the transistor at the dry etching treatment performed to form the gate electrode 104 and the like. The switching characteristics of the transistor might not be obtained when the reaction product is formed continuously along the gate electrode 104 and the source electrode 116a or the drain electrode 116b. Thus, it is preferable to remove the reaction product later. For example, the reaction product can be removed by performing treatment with ozone water and treatment with diluted hydrofluoric acid. At this time, the concentration of the hydrofluoric acid is preferably set to, for example, 0.003 wt %.

This application is based on Japanese Patent Application serial No. 2013-075696 filed with the Japan Patent Office on Apr. 1, 2013, the entire contents of which are hereby incorporated by reference.

What is claimed is:

1. A method for manufacturing a semiconductor device, the method comprising the steps of:
    forming a stacked film comprising a first oxide semiconductor layer and a second oxide semiconductor layer over a substrate;
    forming a mask layer over the stacked film;
    performing a first dry etching treatment to remove a part of the stacked film by etching the stacked film using the mask layer, thereby forming a reaction product on a side surface of the stacked film;
    removing the mask layer;
    performing a wet etching treatment to remove the reaction product after removing the mask layer;
    forming a source electrode and a drain electrode over the stacked film; and
    forming a third oxide semiconductor layer, a gate insulating film and a gate electrode over the stacked film, the source electrode and the drain electrode,
    wherein the gate insulating film is over the third oxide semiconductor layer, and
    wherein the gate electrode is over the gate insulating film.

2. The method according to claim 1, further comprising the steps of:
    reducing the mask layer; and
    performing a second dry etching treatment to perform half etching treatment on the stacked film after reducing the mask layer.

3. The method according to claim 1,
    wherein the mask layer is removed by a second dry etching treatment.

4. The method according to claim 1,
    wherein the first dry etching treatment is performed on the stacked film in an atmosphere containing methane or a rare gas.

5. The method according to claim 1,
    wherein the wet etching treatment is performed on the reaction product using an aqueous solution containing hydrogen fluoride, phosphate, nitric acid, acetic acid or oxalic acid.

6. The method according to claim 1,
    wherein each of the source electrode and the drain electrode includes a first conductive layer and a second conductive layer over the first conductive layer, and
    wherein before forming the second conductive layer, the first conductive layer is washed with water at a temperature higher than or equal to 25° C. and lower than or equal to 100° C.

7. A method for manufacturing a semiconductor device, the method comprising the steps of:
    forming a stacked film comprising a first oxide semiconductor layer and a second oxide semiconductor layer over a substrate;
    forming a mask layer over the stacked film;
    performing a first dry etching treatment to remove a part of the stacked film by etching the stacked film using the mask layer;
    removing the mask layer;
    forming a conductive film over the stacked film;
    forming a resist mask layer over the conductive film;
    performing a second dry etching treatment on the conductive film using the resist mask layer to form a first conductive layer;
    washing the first conductive layer with water at a temperature higher than or equal to 25° C. and lower than or equal to 100° C.;
    forming a second conductive layer over the first conductive layer; and
    forming a third oxide semiconductor layer, a gate insulating film and a gate electrode over the stacked film and the second conductive layer,
    wherein the gate insulating film is over the third oxide semiconductor layer, and
    wherein the gate electrode is over the gate insulating film.

8. The method according to claim 7, further comprising the steps of:
    reducing the mask layer; and
    performing a third dry etching treatment to perform half etching treatment on the stacked film after reducing the mask layer.

9. The method according to claim 7,
    wherein the mask layer is removed by a third dry etching treatment.

10. The method according to claim 7,
    wherein the first dry etching treatment is performed on the stacked film in an atmosphere containing methane or a rare gas.

* * * * *